(12) United States Patent
Su et al.

(10) Patent No.: US 11,783,744 B2
(45) Date of Patent: Oct. 10, 2023

(54) GATE DRIVING CIRCUIT, METHOD FOR DRIVING GATE DRIVING CIRCUIT AND DISPLAY PANEL

(71) Applicants: BEIJING BOE DISPLAY TECHNOLOGY CO., LTD., Beijing (CN); BOE TECHNOLOGY GROUP CO., LTD., Beijing (CN)

(72) Inventors: Qiujie Su, Beijing (CN); Zhihua Sun, Beijing (CN); Yingmeng Miao, Beijing (CN); Yinlong Zhang, Beijing (CN); Feng Qu, Beijing (CN); Seungmin Lee, Beijing (CN); Yanping Liao, Beijing (CN); Xibin Shao, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/445,810

(22) Filed: Aug. 24, 2021

(65) Prior Publication Data

US 2022/0101770 A1  Mar. 31, 2022

(30) Foreign Application Priority Data

Sep. 30, 2020 (CN) .......................... 202011069946.5

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2300/0408* (2013.01); *G09G 2310/0286* (2013.01); *G09G 2310/08* (2013.01)

(58) Field of Classification Search
CPC ............. G09G 3/20; G09G 2300/0408; G09G 2310/0286; G09G 2310/08; G11C 19/28
See application file for complete search history.

(56) References Cited

U.S. PATENT DOCUMENTS

| 2016/0093264 A1* | 3/2016 | Gu ......................... G11C 19/28 345/212 |
| 2019/0392758 A1* | 12/2019 | Kim ..................... H10K 59/131 |
| 2019/0392765 A1* | 12/2019 | Kuk ................... H10K 59/1216 |
| 2019/0392767 A1* | 12/2019 | Kim ..................... G09G 3/3225 |

* cited by examiner

Primary Examiner — Sejoon Ahn
(74) Attorney, Agent, or Firm — Kinney & Lange, P.A.

(57) ABSTRACT

A gate driving circuit, a method for driving the gate driving circuit, and a display panel. The gate driving circuit includes N-stages of cascaded shift registers divided into at least one group of K-stages in which a clock signal terminal of a k-th stage of shift register is connected to receive a k-th clock signal, where N, k and K are positive integers, and $1 \leq k \leq K \leq N$; and an input signal terminal of a n-th stage of shift register is connected to an output signal terminal of a (n−i)-th stage of shift register, and reset signal terminals of the n-th and (n+1)-th stages of shift registers are connected to an output signal terminal of a (n+j)-th stage of shift register, wherein the n is one of an odd number and an even number, where i and j are positive integers, $1<n<N$, $(K−2)/2 \leq i \leq K/2$, and $K/2 < j \leq K−2$.

6 Claims, 26 Drawing Sheets

GATE DRIVING CIRCUIT, METHOD FOR DRIVING GATE DRIVING CIRCUIT AND DISPLAY PANEL

TECHNICAL FIELD

This application claims priority to Chinese Application No. 202011069946.5, filed on Sep. 30, 2020, which is incorporated herein by reference in its entirety.

TECHNICAL FIELD

The present disclosure relates to the field of display technology, and in particular to a gate driving circuit, a method for driving the gate driving circuit, and a display panel.

BACKGROUND

In the display technology, Gate driver On Array (GOA) technology is usually used to implement a gate driving circuit. In the GOA technology, the gate driving circuit is fabricated on an array substrate, and a gate electrode of each pixel in a pixel area may be driven without additional bonding of a gate driving chip. Generally, the shift registers of the gate driving circuit are connected in cascade, so that each shift register generates a gate driving signal shifted sequentially to turn on sub-pixels in the pixel area row by row. However, a traditional gate driving circuit structure has limitations in display.

SUMMARY

The embodiments of the present disclosure provide a gate driving circuit, including N-stages of cascaded shift registers, wherein, the N-stages of cascaded shift registers are divided into at least one group of the K-stages of cascaded shift registers in which a clock signal terminal of a k-th stage of shift register is connected to receive a k-th clock signal, wherein each of N, k and K is a positive integer, and $1 \le k \le K \le N$; and an input signal terminal of a n-th stage of shift register is connected to an output signal terminal of a (n−i)-th stage of shift register, and a reset signal terminal of the n-th stage of shift register and a reset signal terminal of a (n+1)-th stage of shift register are connected to an output signal terminal of a (n+j)-th stage of shift register, wherein n is one of an odd number and an even number, each of i and j is a positive integer, $1<n<N$, $(K-2)/2 \le i \le K/2$, and $K/2 < j \le K-2$.

For example, K=10, the input signal terminal of the n-th stage of shift register is connected to an output signal terminal of a (n−4)-th stage of shift register, and the reset signal terminal of the n-th stage of shift register and the reset signal terminal of the (n+1)-th stage of shift register are connected to an output signal terminal of a (n+6)-th stage of shift register.

For example, K=10, the input signal terminal of the n-th stage of shift register is connected to an output signal terminal of a (n−4)-th stage of shift register, and the reset signal terminal of the n-th stage of shift register and the reset signal terminal of the (n+1)-th stage of shift register are connected to an output signal terminal of a (n+8)-th stage of shift register.

For example, K=8, the input signal terminal of the n-th stage of shift register is connected to an output signal terminal of a (n−4)-th stage of shift register, and the reset signal terminal of the n-th stage of shift register and the reset signal terminal of the (n+1)-th stage of shift register are connected to an output signal terminal of a (n+6)-th stage of shift register.

For example, K=12, the input signal terminal of the n-th stage of shift register is connected to an output signal terminal of a (n−6)-th stage of shift register, and the reset signal terminal of the n-th stage of shift register and the reset signal terminal of the (n+1)-th stage of shift register are connected to an output signal terminal of a (n+8)-th stage of shift register.

For example, K=12, the input signal terminal of the n-th stage of shift register is connected to an output signal terminal of a (n−6)-th stage of shift register, and the reset signal terminal of the n-th stage of shift register and the reset signal terminal of the (n+1)-th stage of shift register are connected to an output signal terminal of a (n+10)-th stage of shift register.

For example, K=14, the input signal terminal of the n-th stage of shift register is connected to an output signal terminal of a (n−6)-th stage of shift register, and the reset signal terminal of the n-th stage of shift register and the reset signal terminal of the (n+1)-th stage of shift register are connected to an output signal terminal of a (n+8)-th stage of shift register.

For example, K=14, the input signal terminal of the n-th stage of shift register is connected to an output signal terminal of a (n−6)-th stage of shift register, and the reset signal terminal of the n-th stage of shift register and the reset signal terminal of the (n+1)-th stage of shift register are connected to an output signal terminal of a (n+10)-th stage of shift register.

For example, K=14, the input signal terminal of the n-th stage of shift register is connected to an output signal terminal of a (n−8)-th stage of shift register, and the reset signal terminal of the n-th stage of shift register and the reset signal terminal of the (n+1)-th stage of shift register are connected to an output signal terminal of a (n+12)-th stage of shift register.

For example, K=16, the input signal terminal of the n-th stage of shift register is connected to an output signal terminal of a (n−6)-th stage of shift register, and the reset signal terminal of the n-th stage of shift register and the reset signal terminal of the (n+1)-th stage of shift register are connected to an output signal terminal of a (n+8)-th stage of shift register.

For example, K=16, the input signal terminal of the n-th stage of shift register is connected to an output signal terminal of a (n−8)-th stage of shift register, and the reset signal terminal of the n-th stage of shift register and the reset signal terminal of the (n+1)-th stage of shift register are connected to an output signal terminal of a (n+10)-th stage of shift register.

For example, K=16, the input signal terminal of the n-th stage of shift register is connected to an output signal terminal of a (n−8)-th stage of shift register, and the reset signal terminal of the n-th stage of shift register and the reset signal terminal of the (n+1)-th stage of shift register are connected to an output signal terminal of a (n+12)-th stage of shift register.

For example, K=16, the input signal terminal of the n-th stage of shift register is connected to an output signal terminal of a (n−8)-th stage of shift register, and the reset signal terminal of the n-th stage of shift register and the reset signal terminal of the (n+1)-th stage of shift register are connected to an output signal terminal of a (n+14)-th stage of shift register.

For example, K/2 is an even number, each of a first clock signal to a k-th clock signal is a cycle signal having a duty cycle of 50%, and each of the first clock signal to the k-th clock signal has a duration of high level being (K/2)*H in each cycle, wherein H represents a unit scanning time which is a time period required for the gate driving circuit to scan a row of pixels.

For example, K/2 is an odd number, each of a first clock signal to a k-th clock signal is a cycle signal with a duty cycle of [(K−2)/2/K]*100%, and each of the first clock signal to the k-th clock signal has a duration of high level being [(K−2)/2]*H in each cycle, wherein H represents a unit scanning time which is a time period required for the gate driving circuit to scan a row of pixels.

For example, each of the shift registers is configured to:

provide a signal of an input signal terminal of the shift register to a pull-up node of the shift register;

generate an output signal at an output signal terminal of the shift register based on a signal of a clock signal terminal of the shift register under a control of a potential of the pull-up node; and reset the pull-up node of the shift register under a control of a signal of a reset signal terminal of the shift register.

The embodiments of the present disclosure further provide a display panel, including the gate driving circuit above mentioned.

The embodiments of the present disclosure further provide a method for driving the gate driving circuit above mentioned, including: applying a first clock signal to a k-th clock signal to the gate driving circuit, so that each stage of shift registers in the gate driving circuit generates an output signal, wherein, in a first mode, a (k+1)-th clock signal is shifted by H relative to a k-th clock signal, so that an output signal generated by a (n+1)-th stage of shift register is shifted by H relative to an output signal generated by a n-th stage of shift register, wherein H represents a unit scanning time which is a time period required for the gate driving circuit to scan a row of pixels;

in a second mode, the k-th clock signal is synchronized with the (k+1)-th clock signal and the k-th clock signal is shifted by 2H relative to a (k+2)-th clock signal, so that the output signal generated by the n-th stage of shift register is synchronized with the output signal generated by the (n+1)-th stage of shift register, and the output signal generated by the n-th stage of shift register is shifted by 2H relative to an output signal generated by a (n+2)-th stage of shift register.

For example, K/2 is an even number, each of the first clock signal to the k-th clock signal is a cycle signal with a duty cycle of 50%, and each of the first clock signal to the k-th clock signal has a duration of high level being (K/2)*H in each cycle.

For example, K/2 is an odd number, each of the first clock signal to the k-th clock signal is a cycle signal with a duty cycle of [(K−2)/2/K]*100%, and each of the first clock signal to the k-th clock signal has a duration of high level being [(K−2)/2]*H in each cycle.

DETAILED DESCRIPTION OF EMBODIMENTS

Although the present disclosure will be fully described with reference to the drawings containing the embodiments of the present disclosure, it should be understood that those skilled in the art may modify the present disclosure described herein while obtaining the technical effects of the present disclosure. Therefore, it should be understood that the above description is a broad revelation for those skilled in the art, and its content is not intended to limit the exemplary embodiments described in the present disclosure.

In addition, in the following detailed description, for easy of explanation, many specific details are set forth to provide a comprehensive understanding of the embodiments of the present disclosure. However, obviously, one or more embodiments may also be implemented without the specific details. In other cases, well-known structures and devices are embodied in an illustrative manner to simplify the drawings.

Figure 1A:
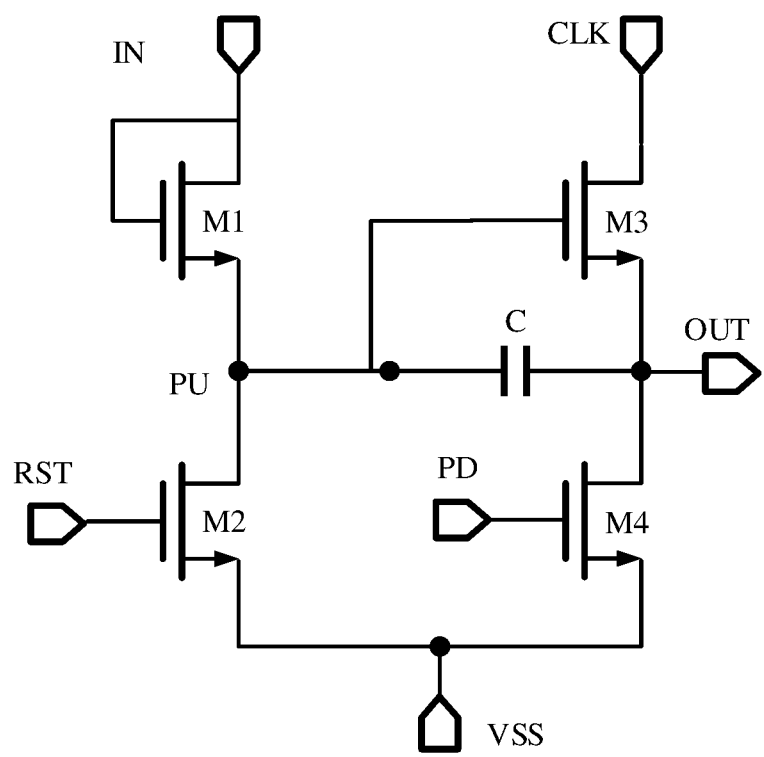
FIG. 1A illustrates a circuit diagram of a shift register according to the embodiments of the present disclosure.

FIG. 1A illustrates a circuit diagram of a shift register according to the embodiments of the present disclosure. As shown in FIG. 1A, the shift register 100 includes an input signal terminal IN, an output signal terminal OUT, a pull-up node PU, a clock signal terminal CLK and a reset signal terminal RST. The shift register 100 may provide a signal of the input signal terminal IN to the pull-up node PU, generate an output signal at the output signal terminal OUT based on a signal of the clock signal terminal CLK under a control of a potential of the pull-up node PU, and reset the pull-up node PU under a control of a signal of the reset signal terminal RST. The shift register 100 may further include a pull-down node PD, and the shift register 100 may pull down the output signal terminal OUT to a potential of a reference signal terminal VSS under a control of the pull-down node PD. In FIG. 1A, the shift register 100 includes transistors M1, M2, M3, and M4 and a capacitor C, and each of the transistors M1 to M4 is N-type transistor. However, this is only for the purpose of explaining the basic working principle of the shift register. The embodiments of the present disclosure are not limited to this, and the shift register 100 may have any other structure as required. For example, the shift register 100 may further include other circuits such as a control circuit and a noise reduction circuit. In some embodiments, the shift register 100 may include a plurality of pull-down circuits, which are respectively used to pull down potentials of different nodes of the shift register 100. In some embodiments, a plurality of transistors in the shift register 100 may be P-type transistors, or some transistors are N-type and some transistors are P-type, and so on.

Figure 1B:
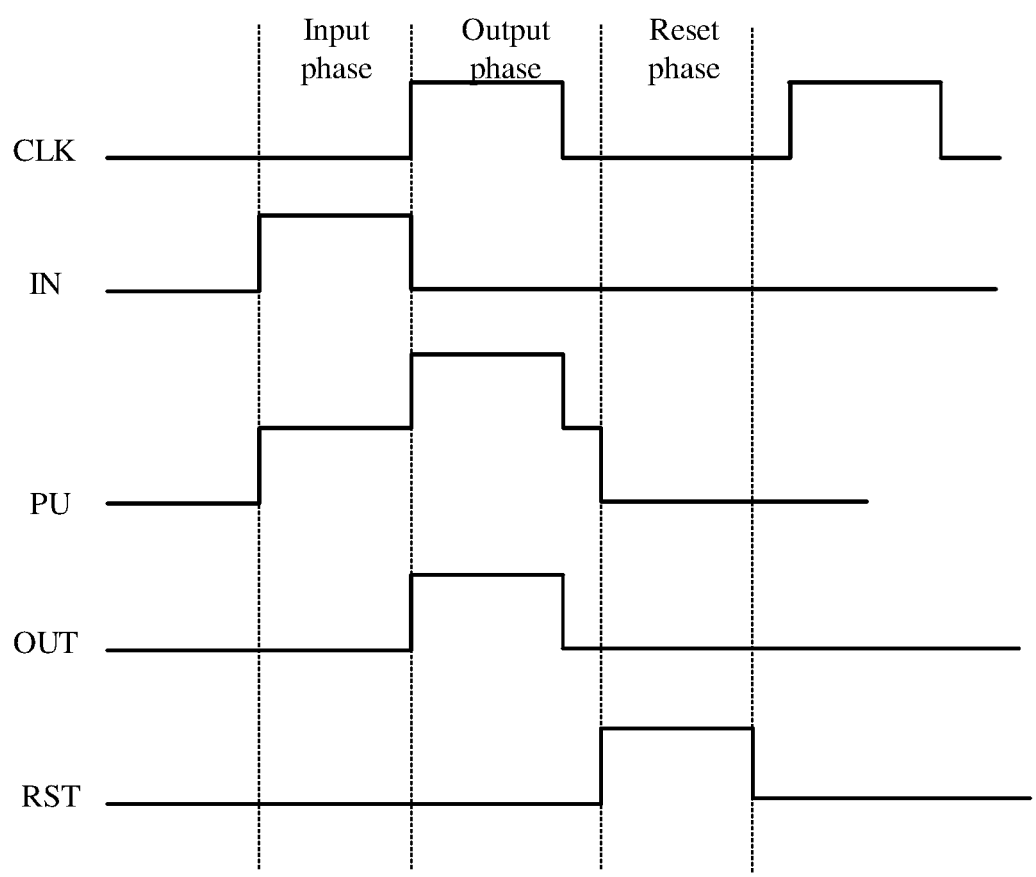
FIG. 1B illustrates a working principle diagram of the shift register of FIG. 1A.

FIG. 1B illustrates a working principle diagram of the shift register of FIG. 1A.

As shown in FIG. 1B, in an input phase, when the input signal terminal IN is at a high level, the transistor M1 is turned on, so that the high level of the input signal terminal IN is input to the pull-up node PU, so that the transistor M3 is turned on. At this time, the clock signal terminal CLK is at a low level, so that the output signal terminal OUT outputs a low level.

In a first sub-period of an output phase, a high level of the clock signal terminal CLK comes. Due to the existence of the capacitor C, the pull-up node PU maintains a high level, and the transistor M3 maintains a turn-on state, thereby providing the high level of the clock signal terminal CLK to the output signal terminal OUT. The bootstrap action of the capacitor C further increases a potential of the pull-up node PU. In a second sub-period of the output phase, the clock signal terminal CLK changes from the high level to a low level. At this time, the transistor M3 still maintains the turn-on state, so that the output signal terminal OUT also becomes a low level.

In a reset phase, the reset signal terminal RST is at a low level, and the transistor M2 is turned on, thereby pulling the pull-up node PU to a low level of the reference signal terminal VSS. A potential of the pull-down node PD may be controlled by the pull-up node PU. For example, when the pull-up node PU is at a high level, the pull-down node PD is at a low level, and the transistor M4 is turned off; and when the pull-up node PU is at a low level, the pull-down node PD is at a high level, and the transistor M4 is turned on, thereby pulling the output signal terminal OUT to a low level.

Figure 2:
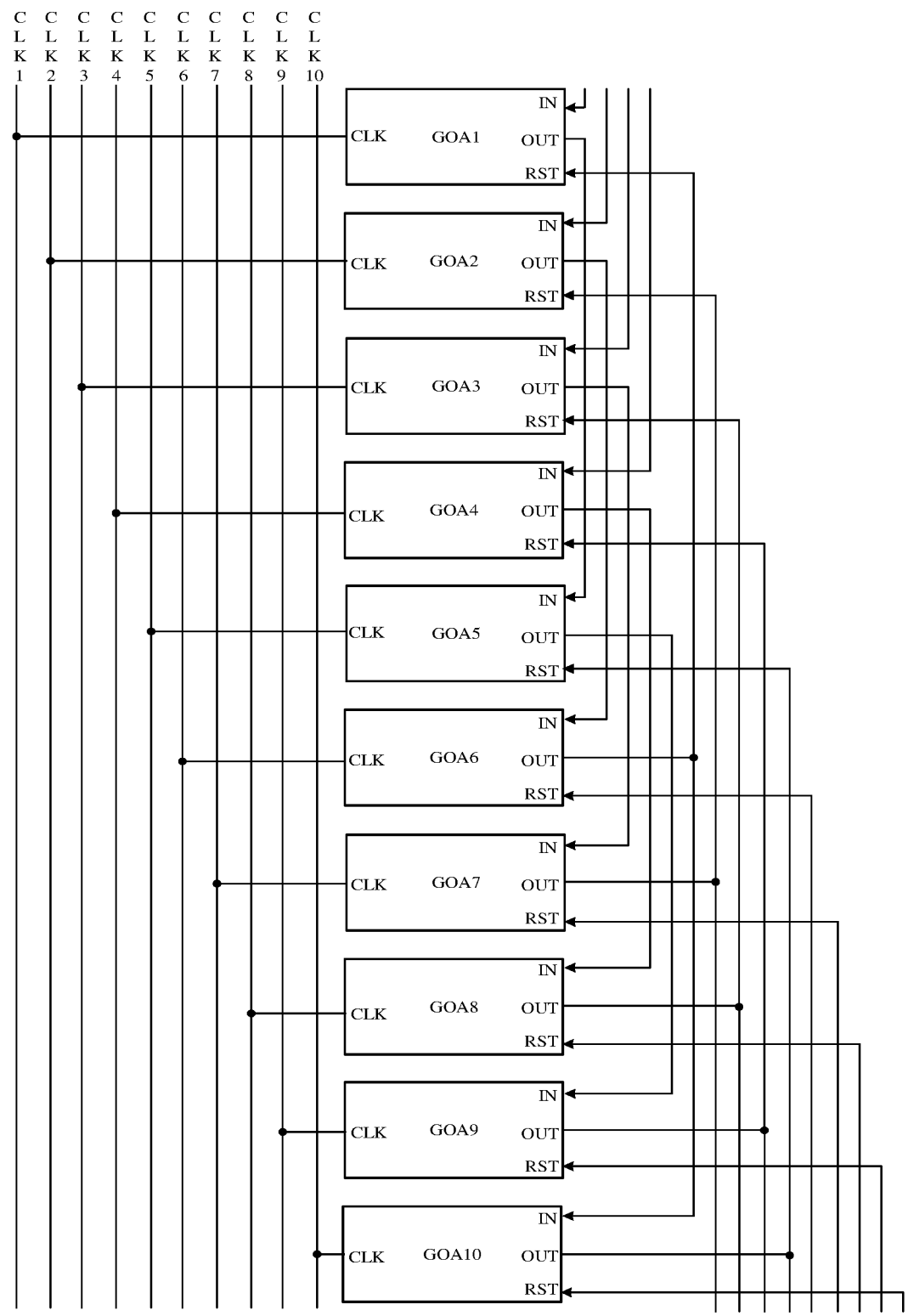
FIG. 2 illustrates a structure diagram of a gate driving circuit.

FIG. 2 illustrates a structure diagram of a gate driving circuit. As shown in FIG. 2, the gate driving circuit includes multi-stages of cascaded shift registers GOA1, GOA2, GOA3 . . . . For ease of brevity, FIG. 2 illustrates 10 stages of shift registers GOA1 to GOA10. The gate driving circuit of FIG. 2 is controlled by 10 clock signals CLK1, CLK2, . . . , CLK10, and clock signal terminals of the shift registers GOA1 to GOA10 are respectively connected to receive the clock signals CLK1 to CLK10. In a similar manner, clock signal terminals of shift registers GOA11 to GOA20 are respectively connected to receive the clock signal terminals CLK1 to CLK10, and so on. In the gate driving circuit of FIG. 2, an input signal terminal IN of a n-th stage of shift register GOAn is connected to an output signal terminal OUT of a (n−4)-th stage of shift register GOA(n−4), and a reset signal terminal RST of the n-th stage of shift register GOAn is connected to an output signal terminal OUT of a (n+5)-th stage of shift register GOA(n+5), wherein n is an integer greater than or equal to 5. For example, an output signal terminal OUT of the first stage of shift register GOA1 is connected to an input signal terminal IN of the fifth stage of shift register GOA5, an output signal terminal OUT of the second stage of shift register GOA2 is connected to an input signal terminal IN of the sixth stage of shift register GOA6, and so on. A reset signal terminal RST of the first stage of shift register GOA1 is connected to an output signal terminal OUT of the sixth stage of shift register GOA6, a reset signal terminal RST of the second stage of shift register GOA2 is connected to an output signal terminal OUT of the seventh stage of shift register GOA7, and so on. Input signal terminals IN of the first stage of shift register GOA1 to the fourth stage of shift register GOA4 may be connected to receive a start signal.

Generally, the clock signals CLK1 to CLK10 are set in such a manner that the shift registers GOA1 to GOA10 generate sequentially shifted output signals to scan sub-pixels of a display area row by row, so that the display area is displayed at full resolution. For example, displaying in 8K resolution may be achieved by a display panel having 8K resolution. However, this scanning method is not suitable for low-resolution display, for example, displaying in 4K resolution cannot be achieved by the display panel of 8K resolution.

The embodiments of the present disclosure provide a method for driving a gate driving circuit, which may scan sub-pixels row by row in a first mode, thereby implementing full resolution display; and in a second mode, scan the sub-pixels two-rows by two-rows, thereby implementing low-resolution display. The method for driving the gate driving circuit of the embodiments of the present disclosure will be described below with reference to FIGS. 3A and 3B.

Figure 3A:
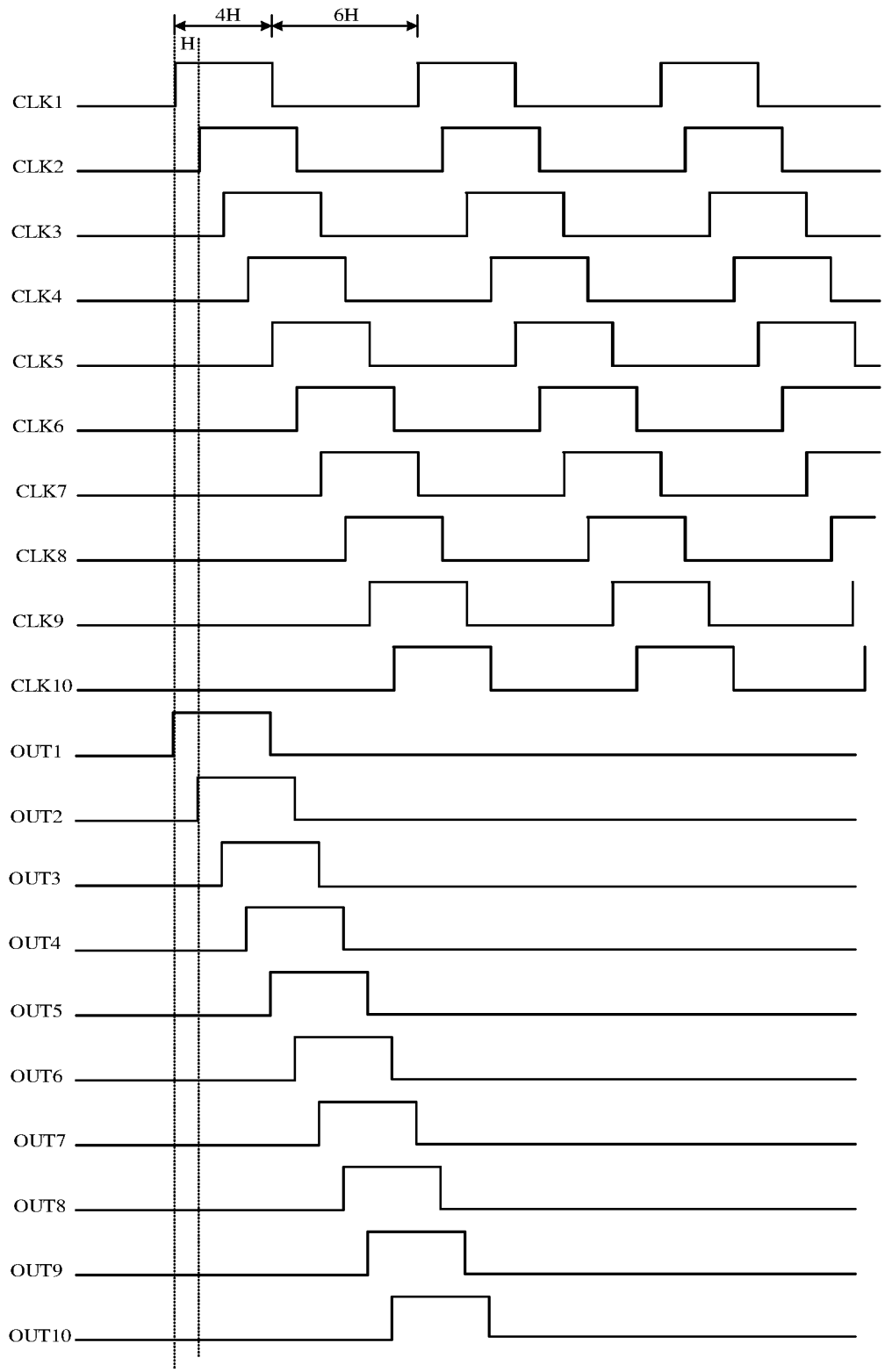
FIG. 3A illustrates a signal timing diagram of a method for driving a gate driving circuit in a first mode according to the embodiments of the present disclosure.
Figure 3B:
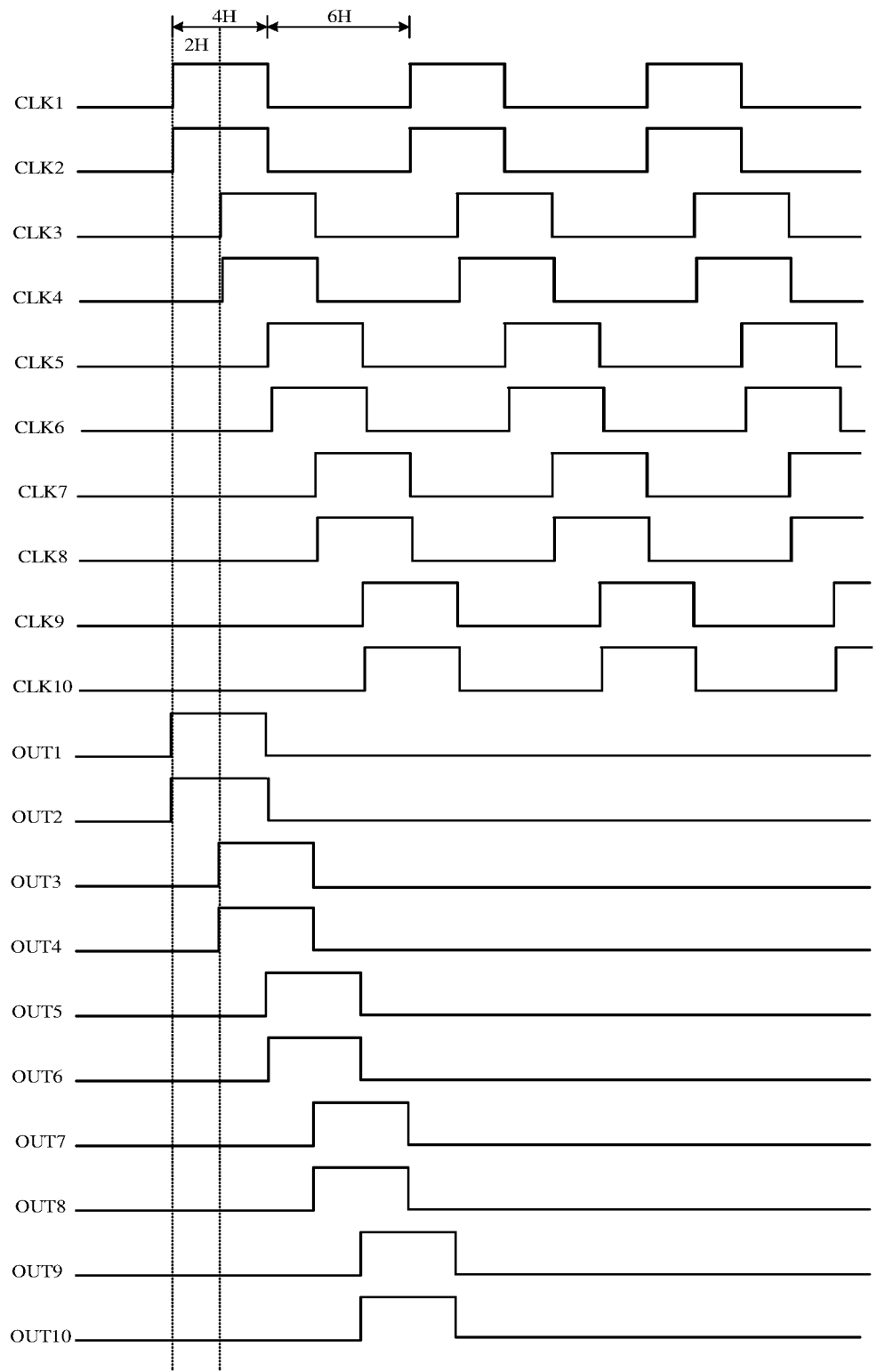
FIG. 3B illustrates a signal timing diagram of a method for driving a gate driving circuit in a second mode according to the embodiments of the present disclosure.

FIG. 3A illustrates a signal timing diagram of the method for driving the gate driving circuit according to the embodiments of the present disclosure in the first mode. FIG. 3B illustrates a signal timing diagram of the method for driving the gate driving circuit according to the embodiments of the present disclosure in the second mode.

As shown in FIGS. 3A and 3B, each of clock signals CLK1 to CLK10 has a high-level duty cycle of 40%, wherein a duration of a high level is 4H, and a duration of a low level is 6H. H represents a unit scanning time, that is, a time period required for the gate driving circuit to scan a row of pixels. Taking the 8K resolution display panel as an example, sub-pixels of the display area of the display panel are arranged in an array of 7680×4320. In the case of a refresh frequency of 60 Hz, a scanning time of 1 frame is 1/60 second, that is, the time period taken to scan 4320 rows of sub-pixels is 1/60 second, so the time period taken to scan each row of sub-pixels (that is, the unit scanning time) H=1/60÷4320≈3.7 μs. Similarly, when a refresh frequency is 120 Hz, the unit scanning time H is about 1.85 μs.

In the first mode, as shown in FIG. 3A, a (k+1)-th clock signal is shifted by H relative to a k-th clock signal. For example, the clock signal CLK2 (second clock signal) is shifted by H relative to the clock signal CLK1 (first clock signal), the clock signal CLK3 (third clock signal) is shifted by H relative to the clock signal CLK2 (second clock signal), and so on. Taking the gate driving circuit of FIG. 2 as an example, according to the working principle of the shift register described above, such setting of the clock signals CLK1 to CLK10 may shaft an output signal OUT (n+1) generated by a (n+1)-th stage of shift register GOA (n+1) by H relative to an output signal OUTn generated by a n-th stage of shift register GOAn, as shown in FIG. 3A. It may be seen that in the first mode, the gate driving circuit may implement row by row scanning of sub-pixels, that is, rows of sub-pixels are sequentially turned on, so that full-resolution display may be implemented.

In the second mode, as shown in FIG. 3B, a k-th clock signal is synchronized with a (k+1)-th clock signal and the k-th clock signal is shifted by 2H relative to a (k+2)-th clock signal. For example, the clock signal CLK1 (first clock signal) is synchronized with the clock signal CLK2 (second clock signal), the clock signal CLK3 (third clock signal) is synchronized with the clock signal CLK4 (fourth clock signal), the clock signal CLK3 (third clock signal) is shifted by 2H relative to the clock signal CLK1 (first clock signal), and so on. Again, taking the gate driving circuit of FIG. 2 as an example, according to the working principle of the shift register described above, such setting of the clock signals CLK1 to CLK10 may synchronize an output signal generated by a n-th stage of shift register with an output signal generated by a (n+1)-th stage of shift register, and the output signal generated by the n-th stage of shift register is shifted by 2H relative to an output signal generated by a (n+2)-th stage of shift register. It may be seen that in the second mode, the gate driving circuit may implement two-line by two-line scanning of sub-pixels, that is, two rows of sub-pixels are turned on at each time, so that display with a half resolution may be implemented.

In practical applications, if the driving method is used to drive the gate driving circuit shown in FIG. 2, a tailing phenomenon will appear in the output signal of the (odd number)-th shift register, and the output signal of the (even number)-th shift register has no tailing, which will be described in detail below with reference to FIG. 4.

Figure 4:
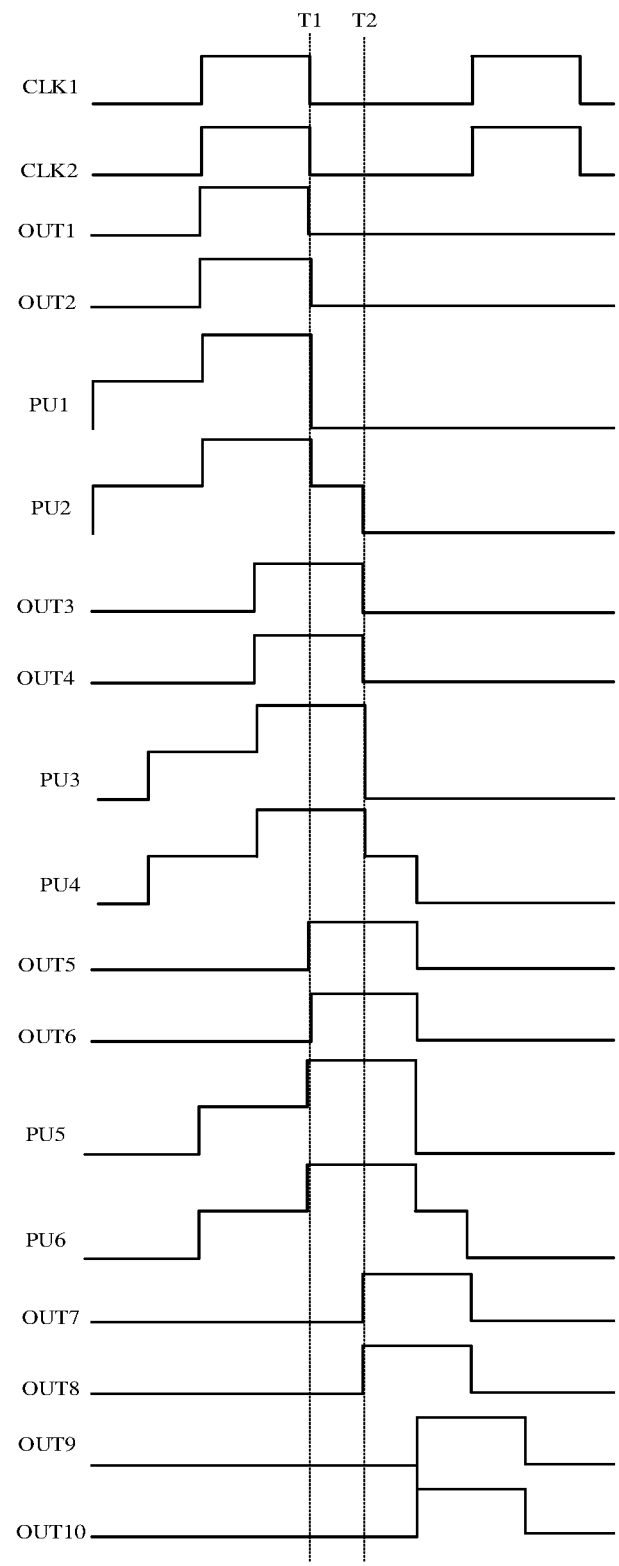
FIG. 4 illustrates the working principle diagram of the gate driving circuit of FIG. 2 in a second mode.

FIG. 4 illustrates a working principle diagram of the gate driving circuit of FIG. 2 in a second mode.

At a time instant T1, each of the clock signals CLK1 and CLK2 becomes low level, so that each of an output signal OUT1 of the first stage of shift register GOA1 and an output signal of the second stage of shift register GOA2 becomes low level. At this time, since the reset signal terminal of the first stage of shift register GOA1 is connected to the output signal terminal of the sixth stage of shift register GOA6, an output signal OUT6 of the sixth stage of shift register GOA6 resets a pull-up node PU1 of the first stage of shift register GOA1 to a low level.

At a time instant T2, since the reset signal terminal of the second stage of shift register GOA2 is connected to the output signal terminal of the seventh stage of shift register GOA7, an output signal OUT7 of the seventh stage of shift register GOA7 resets a pull-up node PU2 of the second stage of shift register GOA2 to a low level.

It may be seen that for the first stage of shift register GOA1, the clock signal CLK1 of the clock signal terminal CLK and a reset signal (ie OUT6) of the reset signal terminal RST simultaneously jump at the time instant T1 (CLK1 changes from high level to low level, and OUT6 changes from low level to high level), which causes the pull-up node PU and the clock signal terminal CLK to become a low level at the same time. At this time, a transistor M3 of the first stage of shift register GOA1 is turned off, and the output signal terminal OUT has not been sufficiently pulled down by the clock signal terminal CLK, so that the output signal OUT1 at the output signal terminal OUT has the tailing.

For the second stage of shift register GOA2, since the second stage of shift register GOA2 is reset by the output signal OUT7 of the seventh stage of shift register GOA7, the pull-up node PU2 is pulled down after the clock signal CLK2 of the clock signal terminal CLK becomes a low level (that is, at the time instant T2), so that a transistor M3 of the second stage of shift register GOA2 remains turn-on until an output signal OUT2 of the output signal terminal OUT is sufficiently pulled down by the clock signal terminal CLK. Therefore, the output signal OUT2 of the second stage of shift register GOA2 has no tailing.

For the same reason, an output signal OUT3 of the third stage of shift register GOA3 has the tailing phenomenon, while an output signal OUT4 of the fourth stage of shift register GOA4 has no tailing, and so on.

Figure 5:
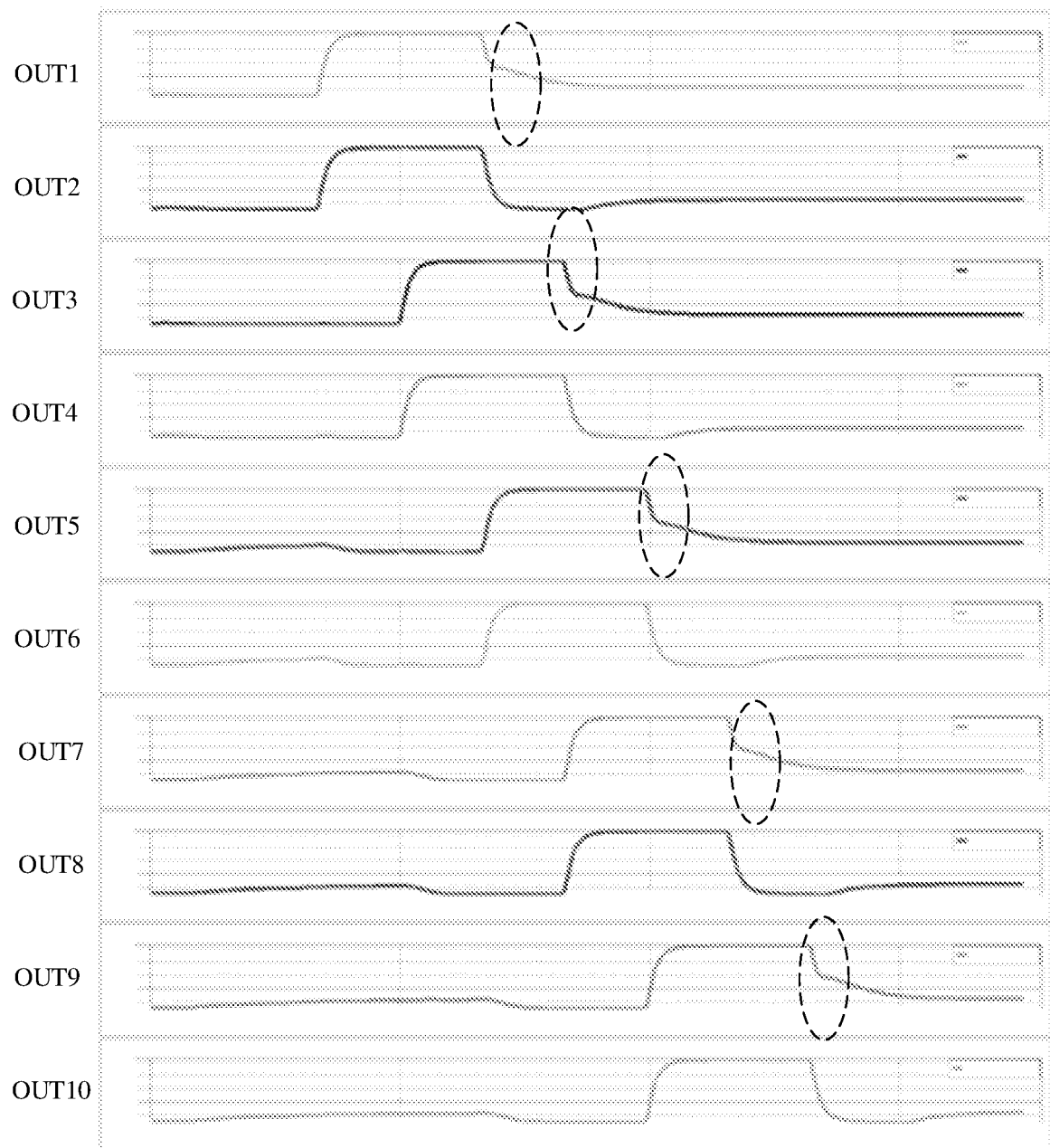
FIG. 5 illustrates a simulation diagram of output signals of the gate driving circuit of FIG. 2 in a second mode.

FIG. 5 illustrates a simulation diagram of output signals of the gate driving circuit of FIG. 2 in the second mode. As may be seen from FIG. 5, for the above described reasons, each of the output signals OUT1, OUT3, OUT5 . . . of the odd numbered stages of shift registers has a tailing (marked by the dashed box in FIG. 5), and the output signals OUT2, OUT4, OUT6 . . . of the even numbered stages of shift registers have no tailing relatively.

The embodiments of the present disclosure provide a gate driving circuit including N-stages of cascaded shift registers. The N-stages of cascaded shift registers are divided into at least one group of K-stages of cascaded shift registers in which a clock signal terminal of a k-th stage of shift register is connected to receive a k-th clock signal. An input signal terminal of a n-th stage of shift register is connected to an output signal terminal of a (n−i)-th stage of shift register, and a reset signal terminal of the n-th stage of shift register and a reset signal terminal of a (n+1)-th stage of shift register of the gate driving circuit are connected to an output signal terminal of a (n+j)-th stage of shift register, wherein the n is one of an odd number and an even number, and each of i and j is a positive integer, 1<n<N, (K−2)/2≤i≤K/2, K/2<j≤K−2. In some embodiments, each of i and j may be an even number. By connecting the reset signal terminal of the n-th stage of shift register and the reset signal terminal of the (n+1)-th stage of shift register to the output signal terminal of the (n+j)-th stage of shift register, it is possible to switch between two driving modes while alleviating the tailing phenomenon caused by the above-mentioned reasons.

Figure 6:
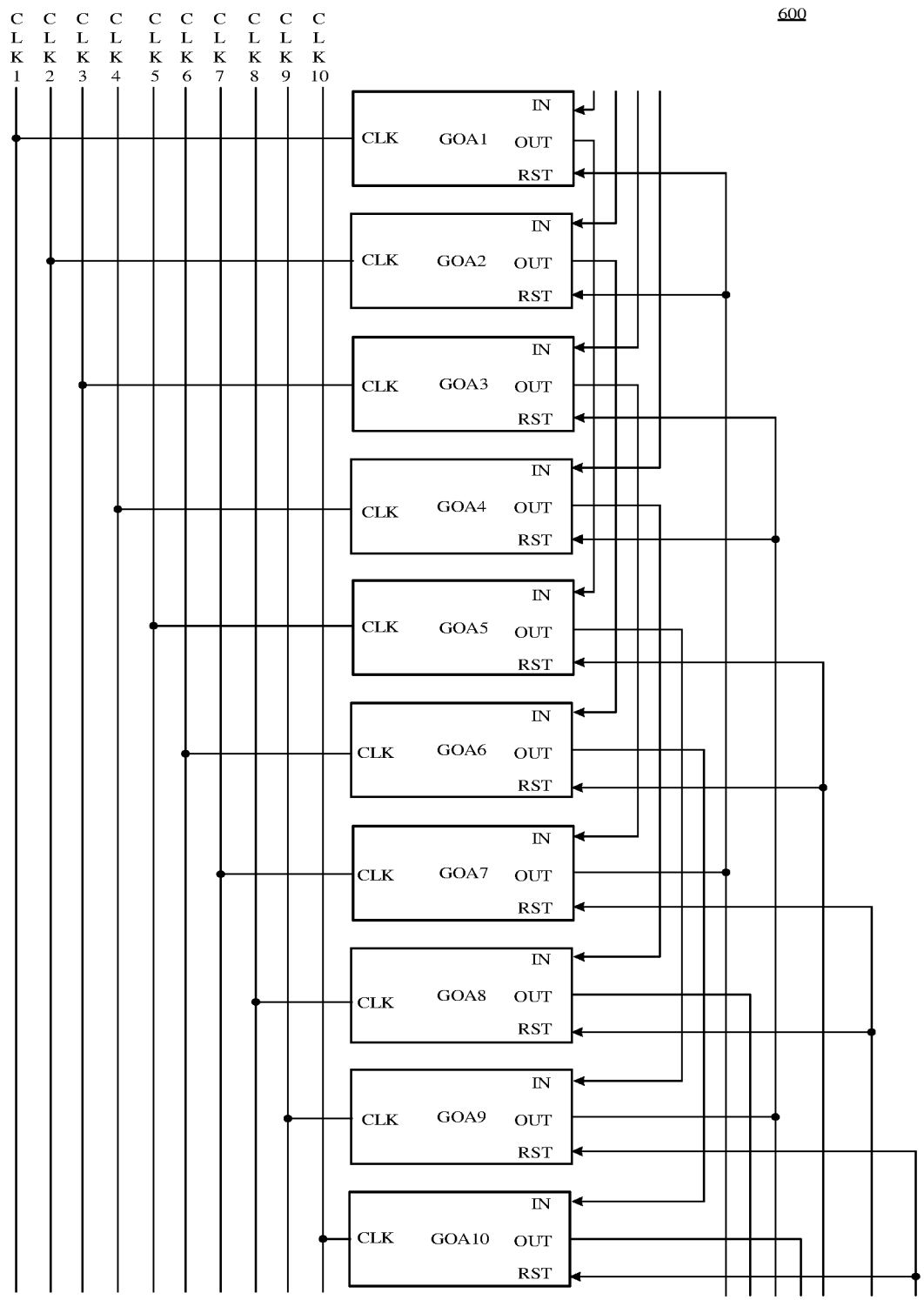
FIG. 6 illustrates a structural diagram of a gate driving circuit according to an embodiment of the present disclosure.

FIG. 6 illustrates a structural diagram of a gate driving circuit according to an embodiment of the present disclosure. In the gate driving circuit 600 of FIG. 6, K=10, i=4, and j=6.

As shown in FIG. 6, the gate driving circuit 600 includes N stages of cascaded shift registers GOA1, GOA2, . . . , GOAN. Each of the shift registers GOA1, GOA2, . . . , GOAN may have an input signal terminal IN, an output signal terminal OUT, a reset signal terminal RST and a pull-up node PU. Each of the shift registers GOA1, GOA2, . . . , GOAN may provide a signal of its own input signal terminal IN to its own pull-up node PU, generate an output signal at its own output signal terminal OUT based on a signal of its own clock signal terminal CLK under a control of a potential of the pull-up node PU, and reset the pull-up node PU under a control of a signal of its own reset signal terminal RST. In some embodiments, at least one of the shift registers GOA1, GOA2, . . . , GOAN may have, for example, the structure described above with reference to FIG. 1A. However, the embodiments of the present disclosure are not limited to this, the shift registers GOA1, GOA2, . . . , GOAN may adopt any structure as required, as long as the shift register function above-mentioned may be implemented.

In FIG. 6, the N-stages of cascaded shift registers are divided into at least one group, and each group includes 10 stages of cascaded shift registers. For ease of brevity, FIG. 6 only illustrates one group of shift registers GOA1, GOA2, . . . , GOA10 which are cascaded into 10 stages. The first stage of shift register GOA1 is connected to receive a first clock signal CLK1, the second stage of shift register is connected to receive a second clock signal CLK2, and so on. Input signal terminals IN of the first stage of shift register GOA1 to the fourth stage of shift register GOA4 may be connected to receive a start signal, an input signal terminal IN of the fifth stage of shift register GOA5 is connected to an output signal terminal OUT of the first stage of shift register GOA1, an input signal terminal IN of the sixth stage of shift register GOA6 is connected to an output signal terminal OUT of the second stage of shift register GOA2, and so on. A reset signal terminal RST of the first stage of shift register GOA1 and a reset signal terminal RST of the second stage of shift register GOA2 are connected to an output signal terminal OUT of the seventh stage of shift register GOA7, a reset signal terminal RST of the third stage of shift register GOA3 and a reset signal terminal RST of the fourth stage of shift register GOA4 are connected to an output signal terminal OUT of the ninth stage of shift register GOA9, and so on.

The gate driving circuit 600 described above with reference to FIG. 6 may be driven by the driving method described above with reference to FIGS. 3A and 3B. For example, the gate driving circuit 600 may be driven by using the clock signals CLK1 to CLK10 of FIGS. 3A and 3B, wherein each of the clock signals CLK1 to CLK10 has a duty cycle of [(K−2)/2/K]*100%=40%, with a duration of high level in each cycle being [(K−2)/2]*H=4H, and a duration of a low level in each cycle being 10H−4H=6H.

In the first mode, as shown in FIG. 3A, the high-level duty cycle of the clock signals CLK1 to CLK10 is 40%, the duration of the high level is 4H, and the duration of the low level is 6H. The (k+1)-th clock signal is shifted by H relative to the k-th clock signal, so that the output signal OUT(n+1) generated by the (n+1)-th stage of shift register GOA(n+1) is shifted by H relative to the output signal OUTn generated by the n-th stage of shift register GOAn. It may be seen that in the first mode, the gate driving circuit 600 may implement row by row scanning of sub-pixels, that is, rows of sub-pixels are sequentially turned on, so that full-resolution display may be implemented.

Figure 7:
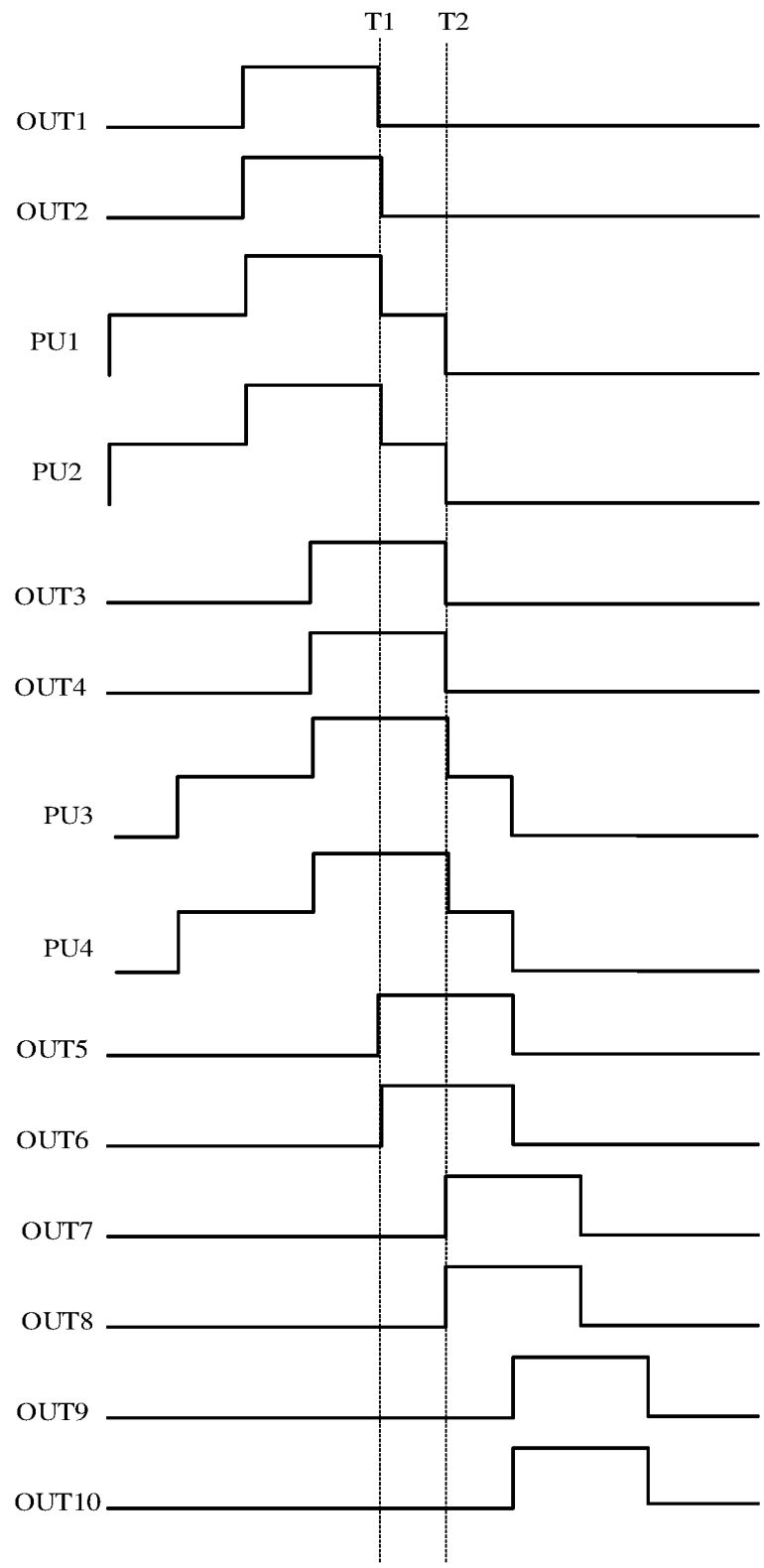
FIG. 7 illustrates a working principle diagram of the gate driving circuit of FIG. 6 in a second mode.

In the second mode, as shown in FIG. 3B and FIG. 7, the duty cycle of the clock signals CLK1 to CLK10 remains unchanged, the k-th clock signal is synchronized with the (k+1)-th clock signal and the k-th clock signal is shifted by 2H relative to the (k+2)-th clock signal, so that the output signal generated by the n-th stage of shift register is synchronized with the output signal generated by the (n+1)-th stage of shift register, and the output signal generated by the n-th stage of shift register is shifted by 2H relative to the output signal generated by the (n+2)-th stage of shift register, thereby achieving scanning of the sub-pixels two-rows by two-rows. But different from FIG. 4, in FIG. 7 the reset signal terminal RST of the n-th stage of shift register GOAn and the reset signal terminal of the (n+1)-th stage of shift register GOA(n+1) of the gate driving circuit are connected to an output signal terminal of a (n+6)-th stage of shift register GOA(n+6), and thus the tailing phenomenon in FIG. 5 can be alleviated or eliminated.

This will be described hereinafter with reference to FIG. 7, by taking the first stage of shift register GOA1 and the second stage of shift register GOA2 as an example.

At a time instant T1, each of the clock signals CLK1 and CLK2 becomes a low level, so that each of an output signal OUT1 of the first stage of shift register GOA1 and an output signal of the second stage of shift register GOA2 becomes low level. Since each of the reset signal terminal RST of the first stage of shift register GOA1 and the reset signal terminal RST of the second stage of shift register GOA2 is connected to the output signal terminal OUT of the seventh stage of shift register GOA7, while a high level of an output signal OUT7 of the output signal terminal OUT of the seventh stage of shift register GOA7 has not yet arrived, so that in the period between the time instant T1 and a time instant T2, neither a pull-up node PU1 of the first stage of shift register GOA1 nor a pull-up node PU2 of the second stage of shift register GOA2 is reset to a low level, a transistor M3 of the first stage of shift register GOA1 and a transistor M3 of the second stage of shift register GOA2 are both kept in turn-on state, and potentials of the pull-up nodes PU1 and PU2 are decreased due to the low levels of the output signals OUT1 and OUT2 respectively.

At the time instant T2, a high level of the output signal OUT7 of the output signal terminal OUT of the seventh stage of shift register GOA7 has not yet arrived. Each of the pull-up node PU1 of the first stage of shift register GOA1 and the pull-up node PU2 of the second stage of shift register GOA2 is reset to a low level.

It may be seen that for the first stage of shift register GOA1, since a reset signal (i.e. OUT7) of the reset signal terminal RST changes to a high level after the time instant T2, not at the time instant T1, there is sufficient time to wait for the clock signal terminal CLK to become a low level before resetting the pull-up node PU1, thereby alleviating or eliminating the tailing phenomenon in the output signal OUT1 of the output signal terminal OUT. For the second stage of shift register GOA2, the principle is the same as that described above with reference to FIG. 4, and the output signal OUT2 of the second stage of shift register GOA2 has no tailing. The third stage of shift register GOA3 and the fourth stage of shift register GOA4 work in the manner similar to the first stage of shift register GOA1 and the second stage of shift register GOA2, respectively, and so on, which will not be repeated here.

Figure 8A:
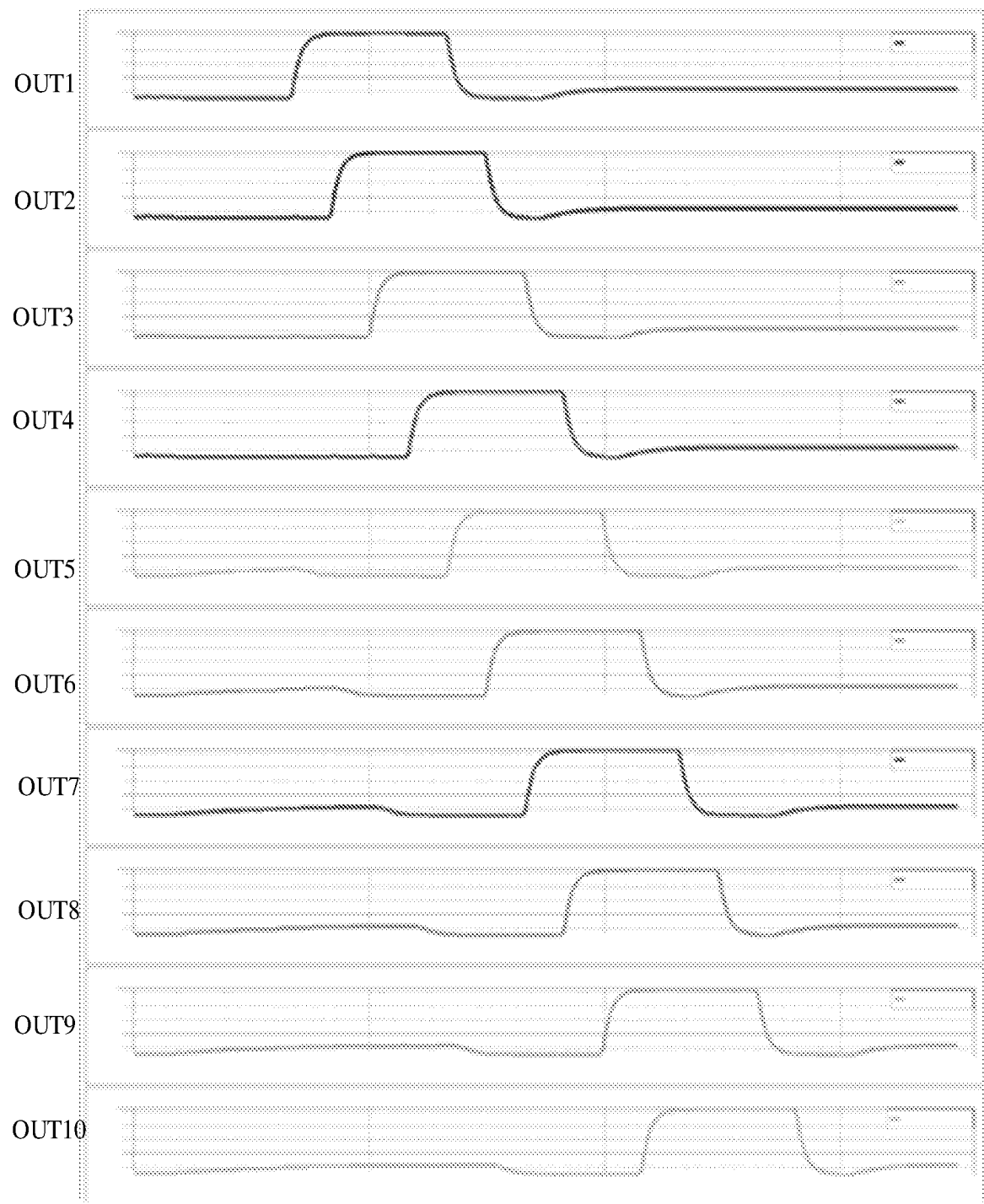
FIG. 8A illustrates a simulation diagram of output signals of the gate driving circuit of FIG. 6 in a first mode.
Figure 8B:
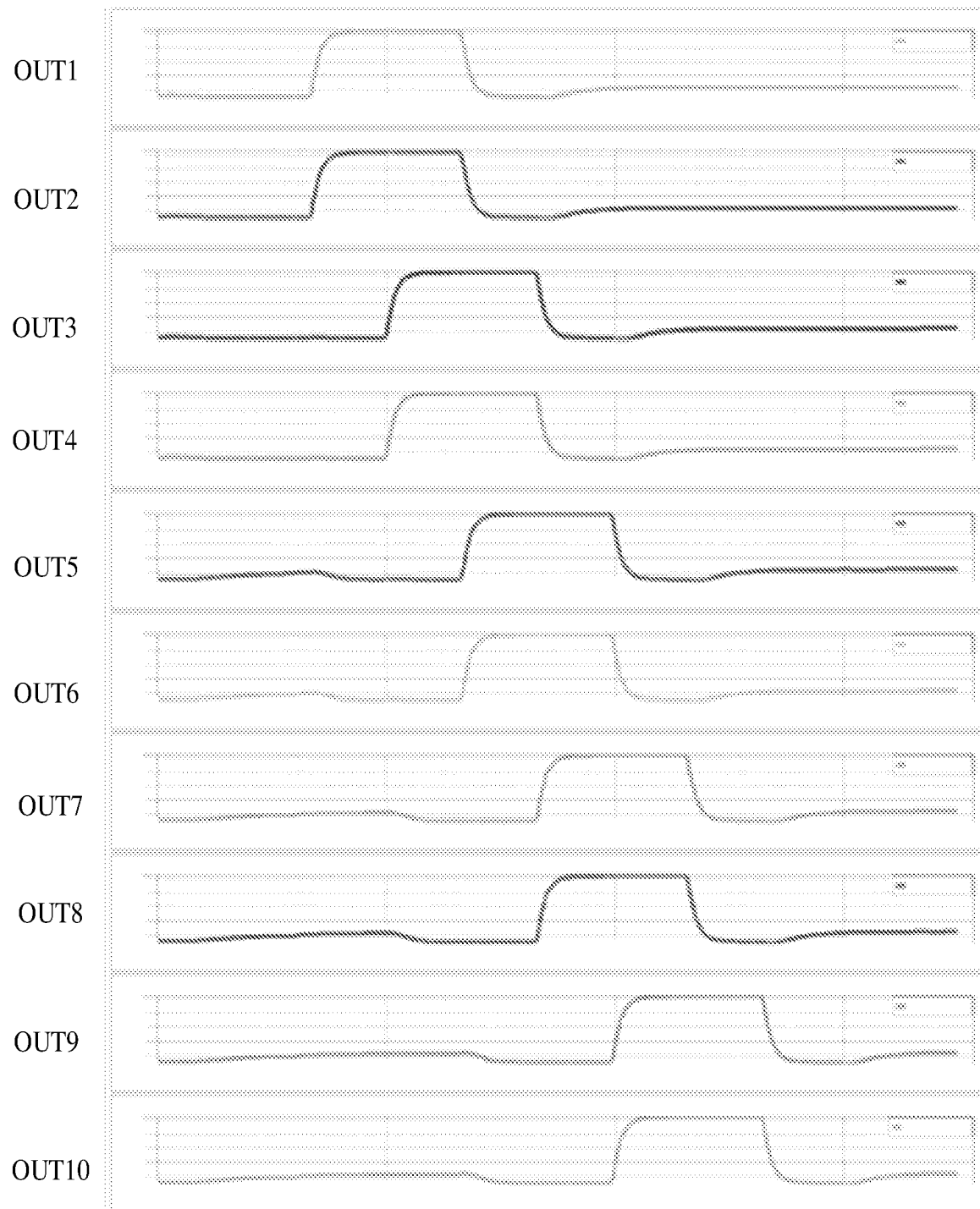
FIG. 8B illustrates a simulation diagram of output signals of the gate driving circuit of FIG. 6 in a second mode.

FIG. 8A illustrates a simulation diagram of an output signal of the gate driving circuit of FIG. 6 in a first mode. FIG. 8B illustrates a simulation diagram of an output signal of the gate driving circuit of FIG. 6 in a second mode. As shown in FIG. 8A, in the first mode, output signals OUT1 to OUT10 of the gate driving circuit 600 are sequentially shifted by H, so as to implement row by row scanning of sub-pixels. As shown in FIG. 8B, in the second mode, output signals of two adjacent shift registers are synchronized, output signals of the next two stages of shift registers are shifted by 2H relative to the upper two stages, so as to implement two-rows by two-rows scanning of sub-pixels. It may be seen that output signals OUT1 to OUT10 of the gate driving circuit 600 no longer have a tailing phenomenon in the second mode.

Figure 9:
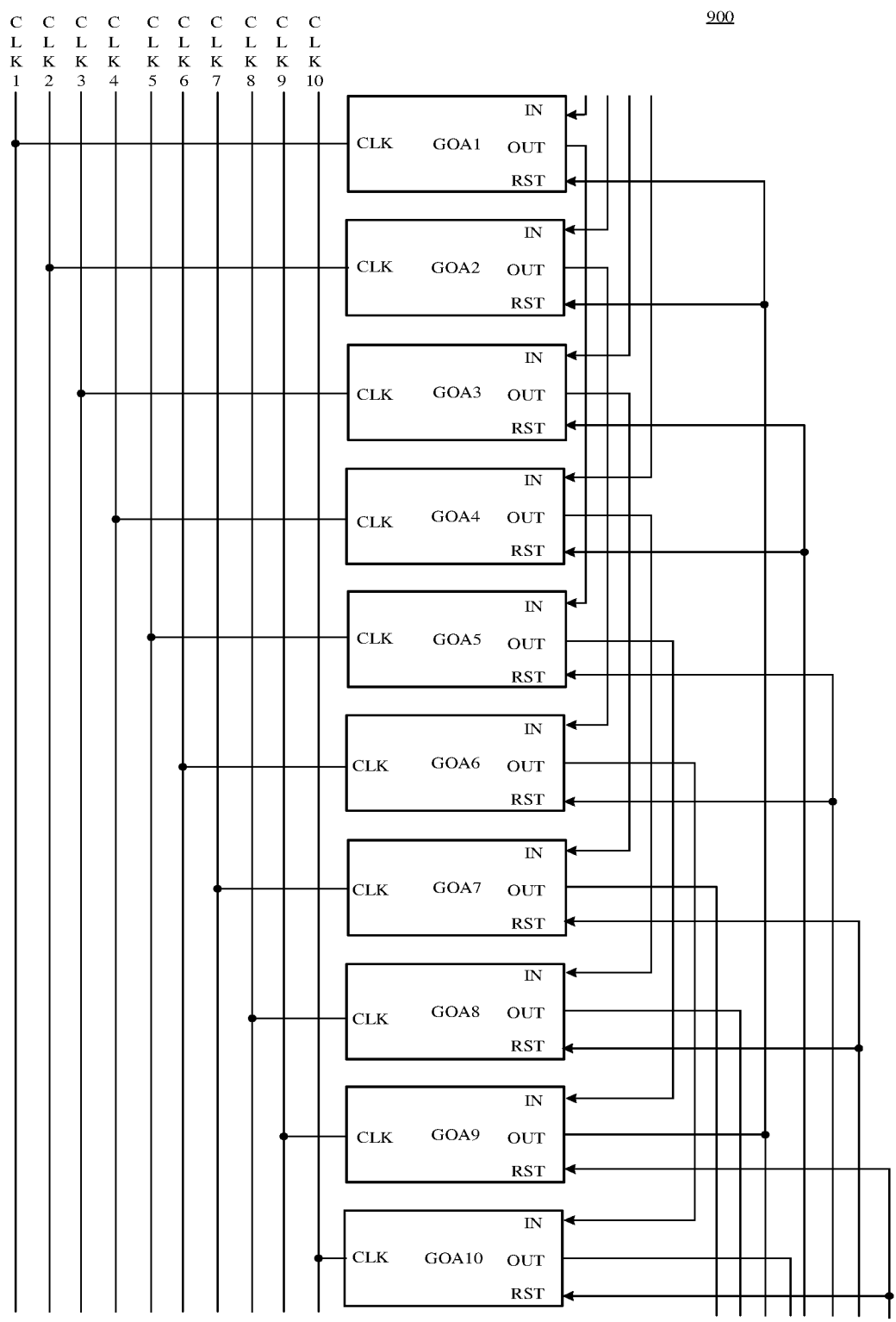
FIG. 9 illustrates a structure diagram of a gate driving circuit according to another embodiment of the present disclosure.

FIG. 9 illustrates a structure diagram of a gate driving circuit according to another embodiment of the present disclosure. In the gate driving circuit 900 of FIG. 9, K=10, i=4, and j=8. The gate driving circuit 900 is similar to the gate driving circuit 600, and the difference is at least j=8. For ease of brevity, the following will mainly explain the difference in detail.

As shown in FIG. 9, a reset signal terminal RST of a first stage of shift register GOA1 and a reset signal terminal RST of a second stage of shift register GOA2 are connected to an output signal terminal OUT9 of a ninth stage of shift register GOA9, a reset signal terminal RST of a third stage of shift register GOA3 and a reset signal terminal RST of a fourth stage of shift register GOA4 are connected to an output signal terminal OUT11 of a eleventh stage of shift register GOA11, and so on. It is also possible to drive the gate driving circuit 900 with the signal timing described above with reference to FIGS. 3A and 3B. Similar to FIG. 7, a reset signal (OUT9) of the first stage of shift register GOA1 and a reset signal of the second stage of shift register GOA2 of the gate drive circuit 900 may become a high level after output signals OUT1 and OUT2 become a low level, thereby alleviating or eliminating the tailing of the output signal OUT1. By the same principle, it is also possible to alleviate or eliminate the tailing in the output signals of other odd numbered stages of shift registers of the gate driving circuit 900.

Figure 10:
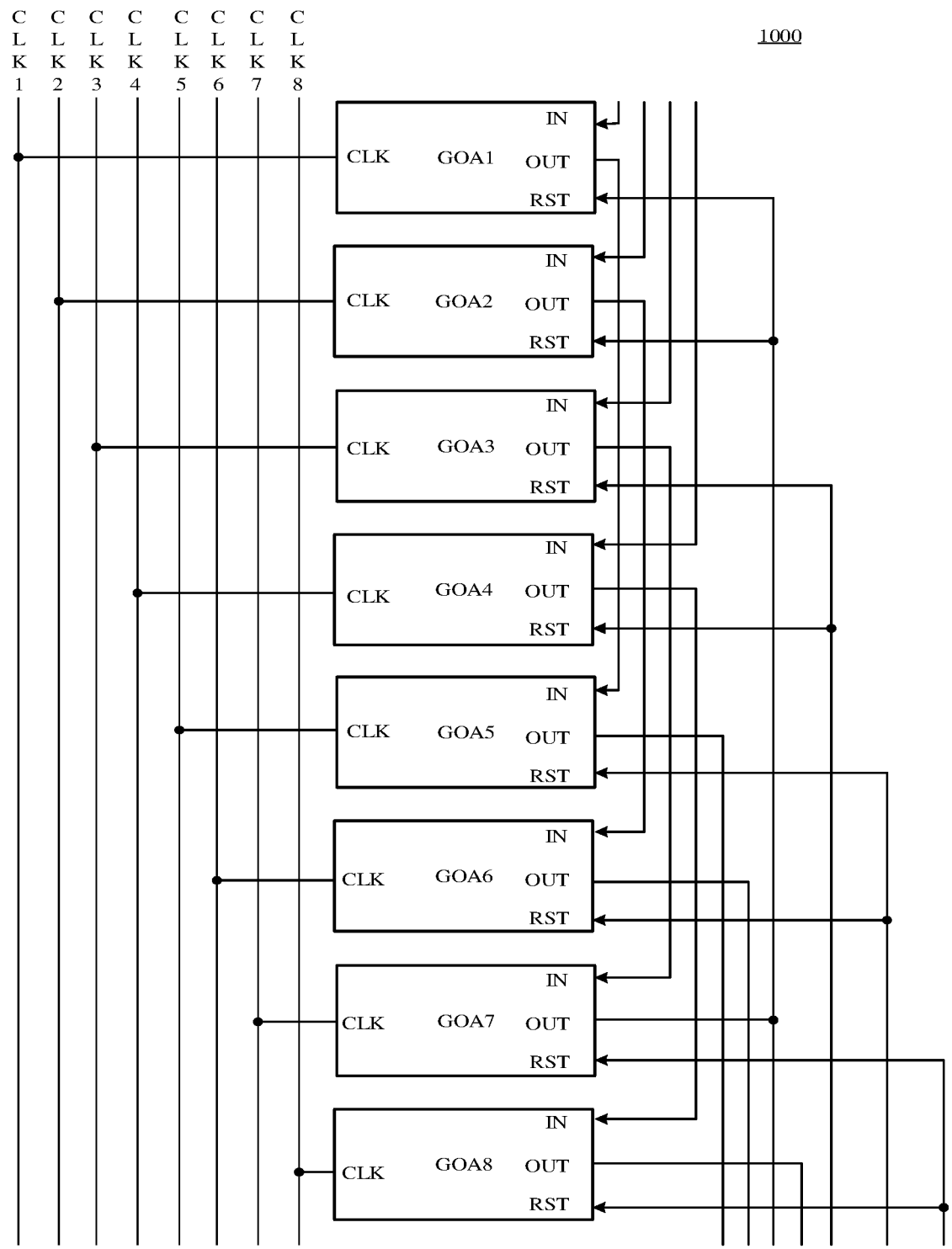
FIG. 10 illustrates a structural diagram of a gate driving circuit according to another embodiment of the present disclosure.

FIG. 10 illustrates a structural diagram of a gate driving circuit according to another embodiment of the present disclosure. In the gate driving circuit 1000 of FIG. 10, K=8, i=4, and j=6. The gate driving circuit 1000 is similar to the gate driving circuit 600 in FIG. 6, and the difference is at least K=8. For ease of brevity, the different part will be mainly described in detail.

As shown in FIG. 10, the gate driving circuit 1000 includes a group of eight shift registers, and eight clock signals CLK1 to CLK8 are used to control each group of eight shift registers. As shown in FIG. 10, shift registers GOA1 to GOA8 are connected to receive clock signals CLK1 to CLK8, respectively. Input signal terminals IN, output signal terminals OUT and reset signal terminals RST of the shift registers GOA1 to GOA8 are connected in the same manner as that in FIG. 6, which will not be repeated here.

Figure 11A:
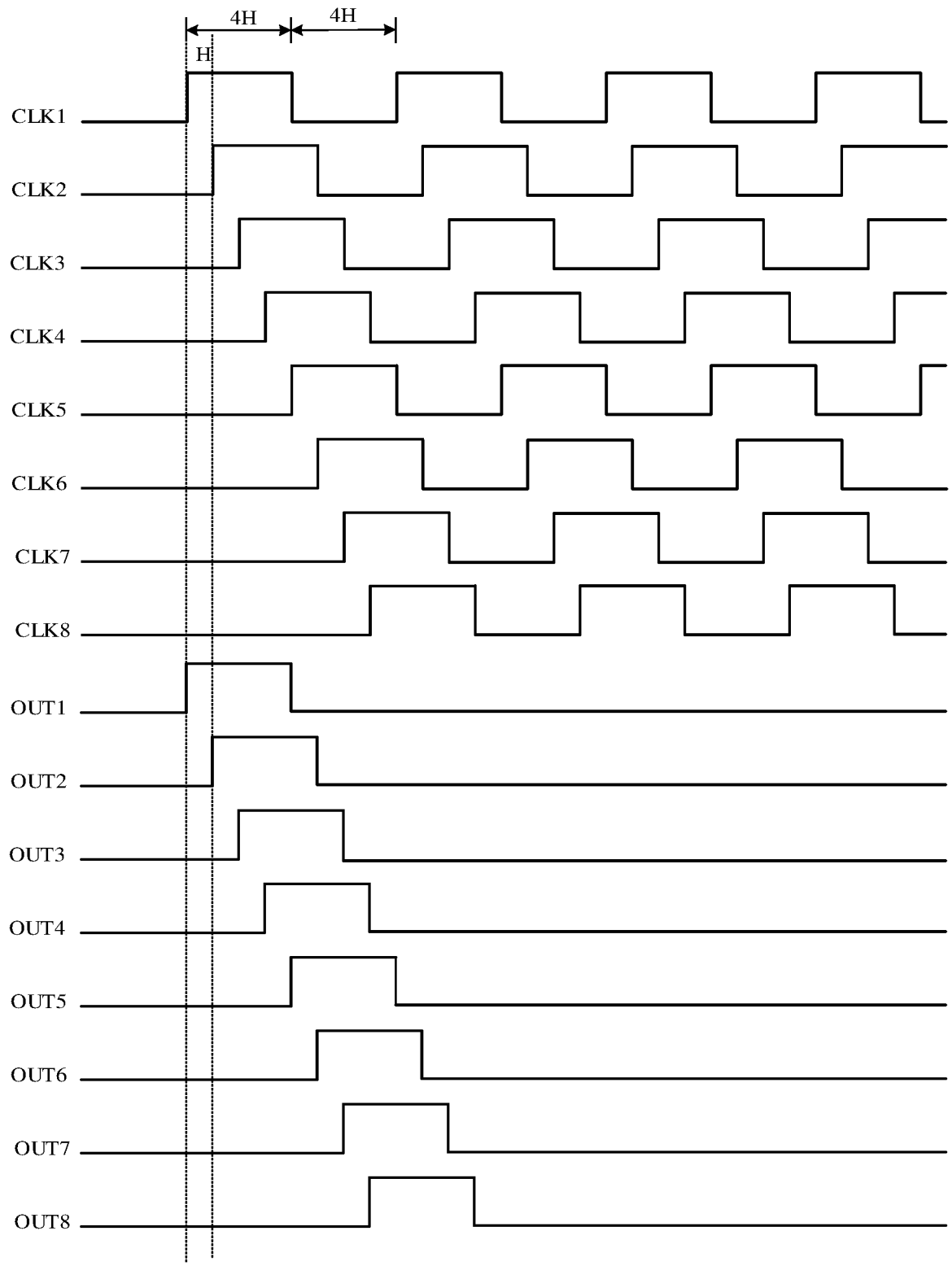
FIG. 11A illustrates a signal timing diagram of a gate driving circuit in a first mode in a case of K=8 according to the embodiments of the present disclosure.
Figure 11B:
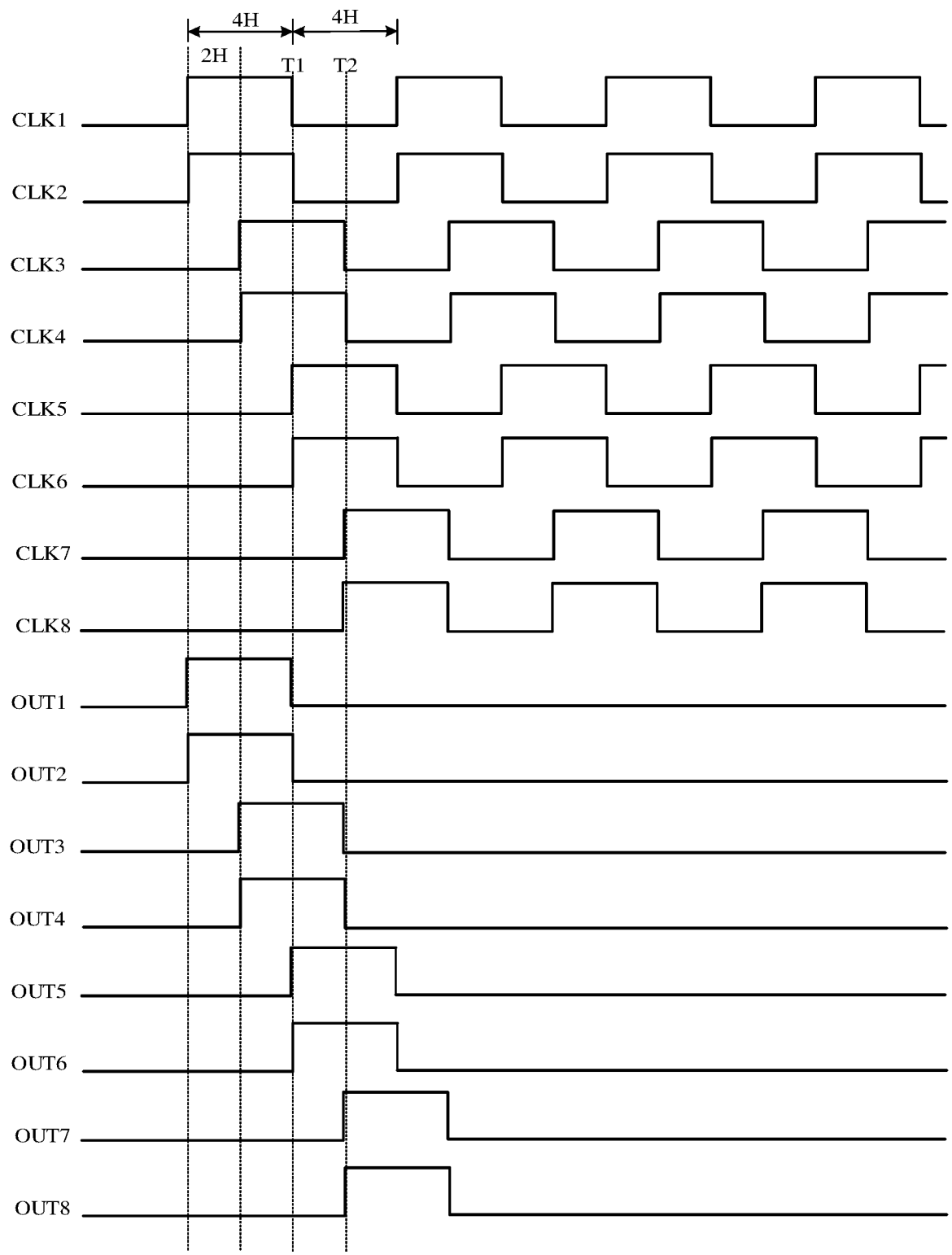
FIG. 11B illustrates a signal timing diagram of a gate driving circuit in a second mode in a case of K=8 according to an embodiment of the present disclosure.

FIG. 11A illustrates a signal timing diagram of a gate driving circuit in a first mode in a case of K=8 according to the embodiments of the present disclosure. FIG. 11B illustrates a signal timing diagram of a gate driving circuit in a second mode in a case of K=8 according to the embodiments of the present disclosure. The signal timing shown in FIGS. 11A and 11B may be used to drive the gate driving circuit 1000 described above with reference to FIG. 10.

As shown in FIG. 11A and FIG. 11B, clock signals CLK1 to CLK8 are cycle signals with a duty ratio of 50%. In a signal cycle, a duration of a high level is (K/2)*H=4H, and a duration of a low level is 4H. In the first mode, as shown in FIG. 11A, the clock signals CLK1 to CLK8 are sequentially shifted by H, so that output signals OUT1 to OUT8 of the shift registers GOA1 to GOA8 are sequentially shifted by H. In the second mode, as shown in FIG. 11B, among the clock signals CLK1 to CLK8, two adjacent clock signals are synchronized, while the two adjacent clock signals are shifted by 2H relative to the next two adjacent clock signals, so that output signals of the two adjacent stages of shift registers are synchronized, while the output signals of the two adjacent stages of shift registers are shifted by 2H relative to output signals of the next two adjacent stages of shift registers, thereby implementing two-rows by two-rows scanning of sub-pixels. As shown in FIG. 11B, for the gate driving circuit 1000 of FIG. 10, at a time instant T1, the clock signals CLK1 and CLK2 provided to the shift registers GOA1 and GOA2 become a low level. At a time instant T2 after the time instant T1, a reset signal (OUT7) of the shift register GOA1 and a reset signal (OUT7) of the shift register GOA2 become a high level, so that the pull-up node of each of the shift registers GOA1 and GOA2 has enough time to wait for the output signal terminal to become a low level before being reset, so as to alleviate or eliminate the above-mentioned tailing phenomenon. In the same way, the tailing phenomenon of other odd-numbered shift registers may also be alleviated or eliminated.

Figure 12:
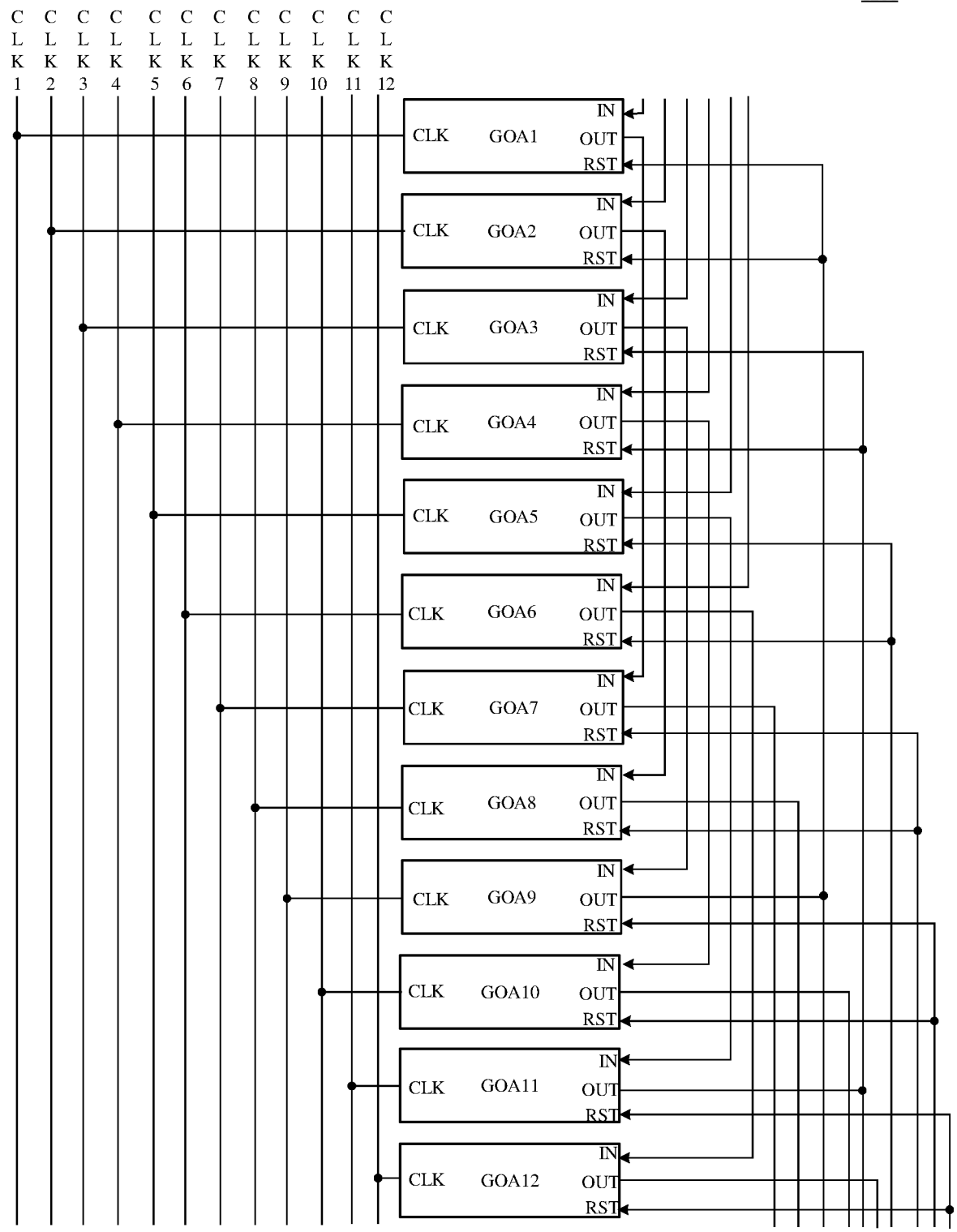
FIG. 12 illustrates a structural diagram of a gate driving circuit according to another embodiment of the present disclosure.

FIG. 12 illustrates a structural diagram of a gate driving circuit according to another embodiment of the present disclosure. In the gate driving circuit 1200 of FIG. 12, K=12, i=6, and j=8. The gate driving circuit 1200 of FIG. 12 is similar to the gate driving circuit 900 of FIG. 9, the difference is at least K=12 and i=6. That is, 12 clock signals CLK1 to CLK12 are used to control each group of twelve shift registers. As shown in FIG. 12, shift registers GOA1 to GOA12 are respectively connected to receive the clock signals CLK1 to CLK12, wherein an input signal IN terminal of a n-th stage of shift register GOAn is connected to an output signal terminal OUT of a (n−6)-th stage of shift register GOA(n−6), a reset signal terminal RST of the n-th stage of shift register GOAn and a reset signal terminal RST of a (n+1)-th stage of shift register GOA(n+1) are connected to an output signal terminal OUT of a (n+8)-th stage of shift register GOA(n+8).

Figure 13:
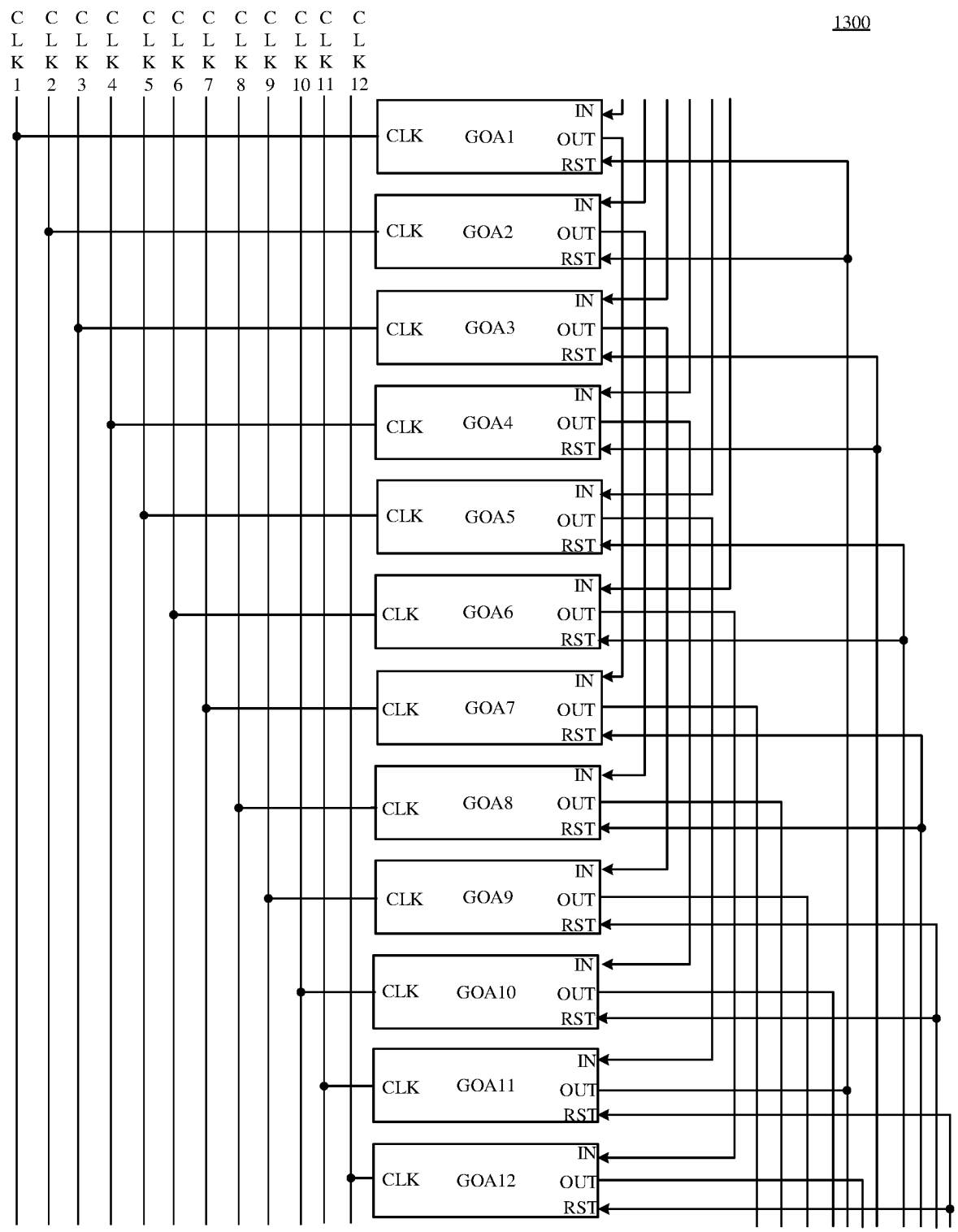
FIG. 13 illustrates a structural diagram of a gate driving circuit according to another embodiment of the present disclosure.

FIG. 13 illustrates a structural diagram of a gate driving circuit according to another embodiment of the present disclosure. In the gate driving circuit 1300 of FIG. 13, K=12, i=6, and j=10. The gate driving circuit 1300 of FIG. 13 is similar to the gate driving circuit 1200 of FIG. 12, and the difference is at least j=10. As shown in FIG. 13, an input signal IN terminal of a n-th stage of shift register GOAn is connected to an output signal terminal OUT of a (n−6)-th stage of shift register GOA(n−6), a reset signal terminal RST of the n-th stage of shift register GOAn and a reset signal terminal RST of a (n+1)-th stage of shift register GOA(n+1) are connected to an output signal terminal OUT of a (n+10)-th stage of shift register GOA(n+10).

Figure 14A:
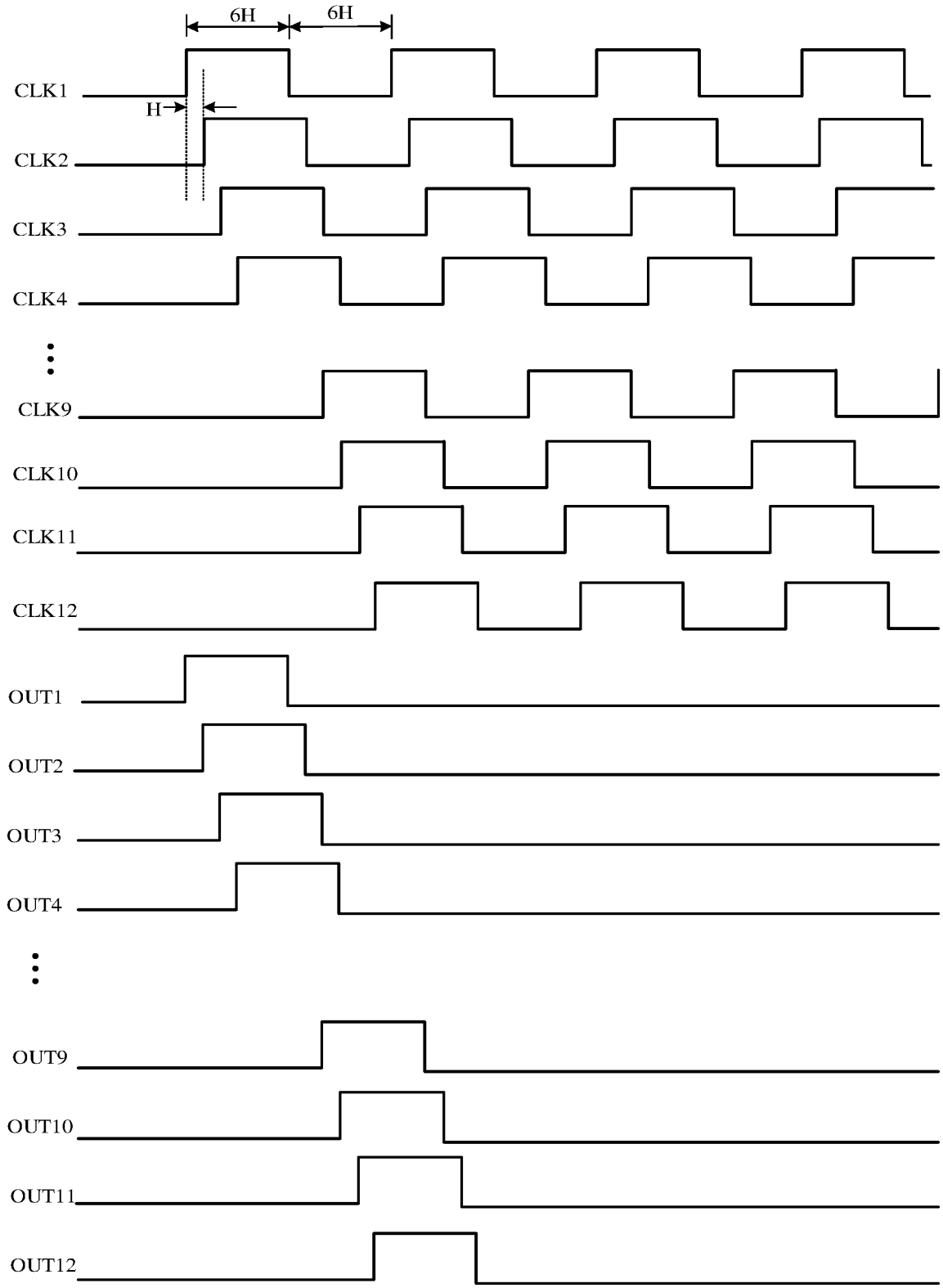
FIG. 14A illustrates a signal timing diagram of a gate driving circuit in a first mode in a case of K=12 according to the embodiments of the present disclosure.
Figure 14B:
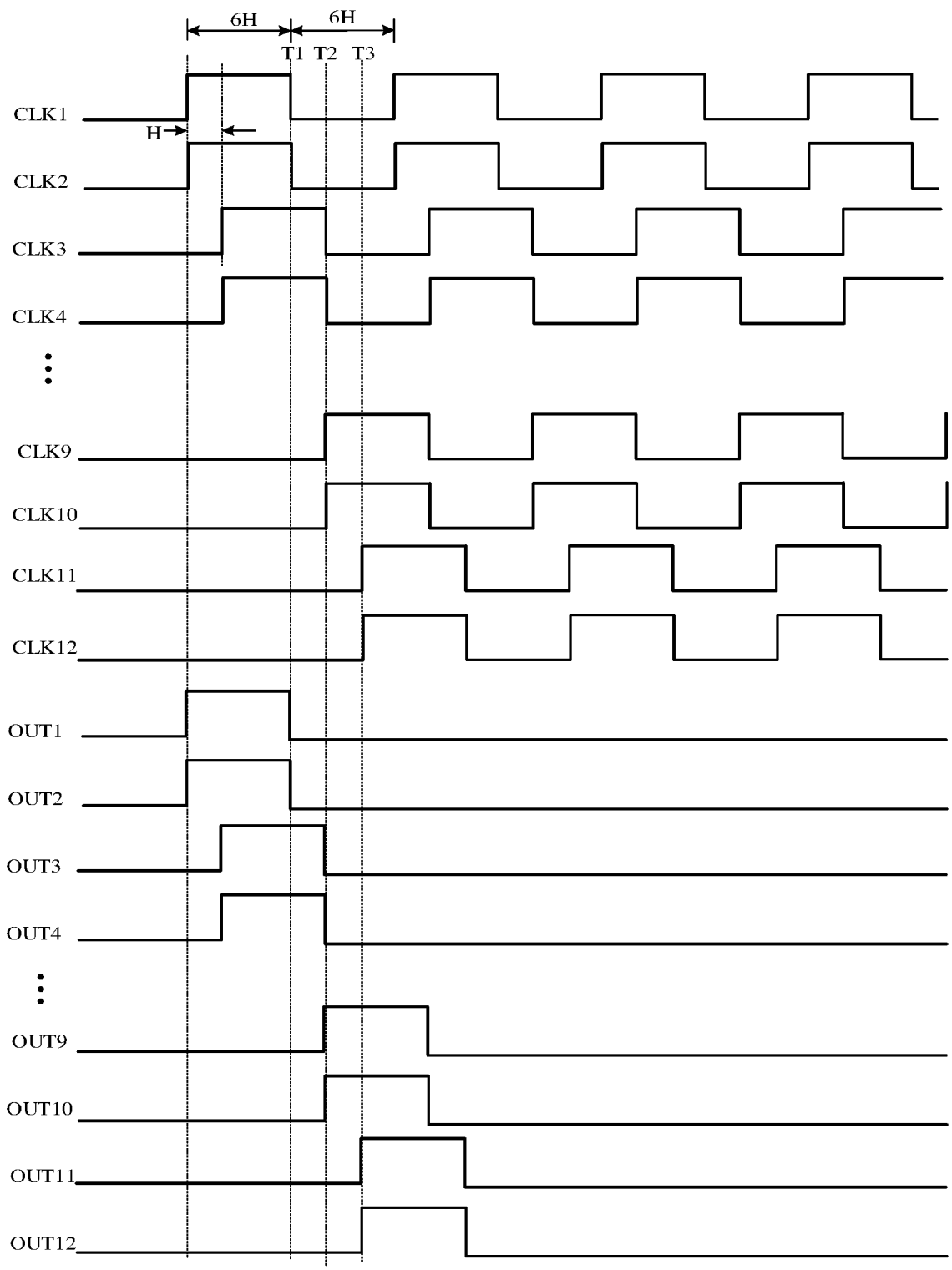
FIG. 14B illustrates a signal timing diagram of a gate driving circuit in a second mode in a case of K=12 according to the embodiments of the present disclosure.

FIG. 14A illustrates a signal timing diagram of a gate driving circuit in a first mode in a case of K=12 according to the embodiments of the present disclosure. FIG. 14B illustrates a signal timing diagram of a gate driving circuit in a second mode in a case of K=12 according to the embodiments of the present disclosure. The signal timing shown in FIGS. 14A and 14B may be used to drive at least one of the gate driving circuits 1200 and 1300 described above.

As shown in FIGS. 14A and 14B, clock signals CLK1 to CLK12 are cycle signals with a duty ratio of 50%. In a signal cycle, a duration of a high level is (K/2)*H=6H, and a duration of a low level is 6H. In the first mode, as shown in FIG. 14A, the clock signals CLK1 to CLK12 are sequentially shifted by H, so that output signals OUT1 to OUT12 of shift registers GOA1 to GOA12 are sequentially shifted by H. In the second mode, as shown in FIG. 14B, among the clock signals CLK1 to CLK12, two adjacent clock signals are synchronized, while the two adjacent clock signals are shifted by 2H relative to the next two adjacent clock signals, so that output signals of the two adjacent stages of shift registers are synchronized, while the output signals of the two adjacent stages of shift registers are shifted by 2H relative to output signals of the next two adjacent stages of shift registers, thereby implementing two-rows by two-rows scanning of sub-pixels.

As shown in FIG. 14B, for the gate driving circuit 1200 of FIG. 12, at a time instant T1, the clock signals CLK1 and CLK2 provided to the shift registers GOA1 and GOA2 become a low level, while at a time instant T2 after the time instant T1, a reset signal (OUT9) of the shift register GOA1 and a reset signal (OUT9) of the shift register GOA2 become a high level, so that the pull-up node of each of the shift registers GOA1 and GOA2 has enough time to wait for the output signal terminal to become a low level before being reset, so as to alleviate or eliminate the above-mentioned tailing phenomenon.

As shown in FIG. 14B, for the gate driving circuit 1200 of FIG. 13, at a time instant T1, the clock signals CLK1 and CLK2 provided to the shift registers GOA1 and GOA2 become a low level, and at a time instant T3 after the time instant T1, a reset signal (OUT11) of the shift register GOA1 and a reset signal (OUT11) of the shift register GOA2 become a high level, so that the pull-up node of each of the shift registers GOA1 and GOA2 has enough time to wait for the output signal terminal to become a low level before being reset, so as to alleviate or eliminate the above-mentioned tailing phenomenon.

Figure 15:
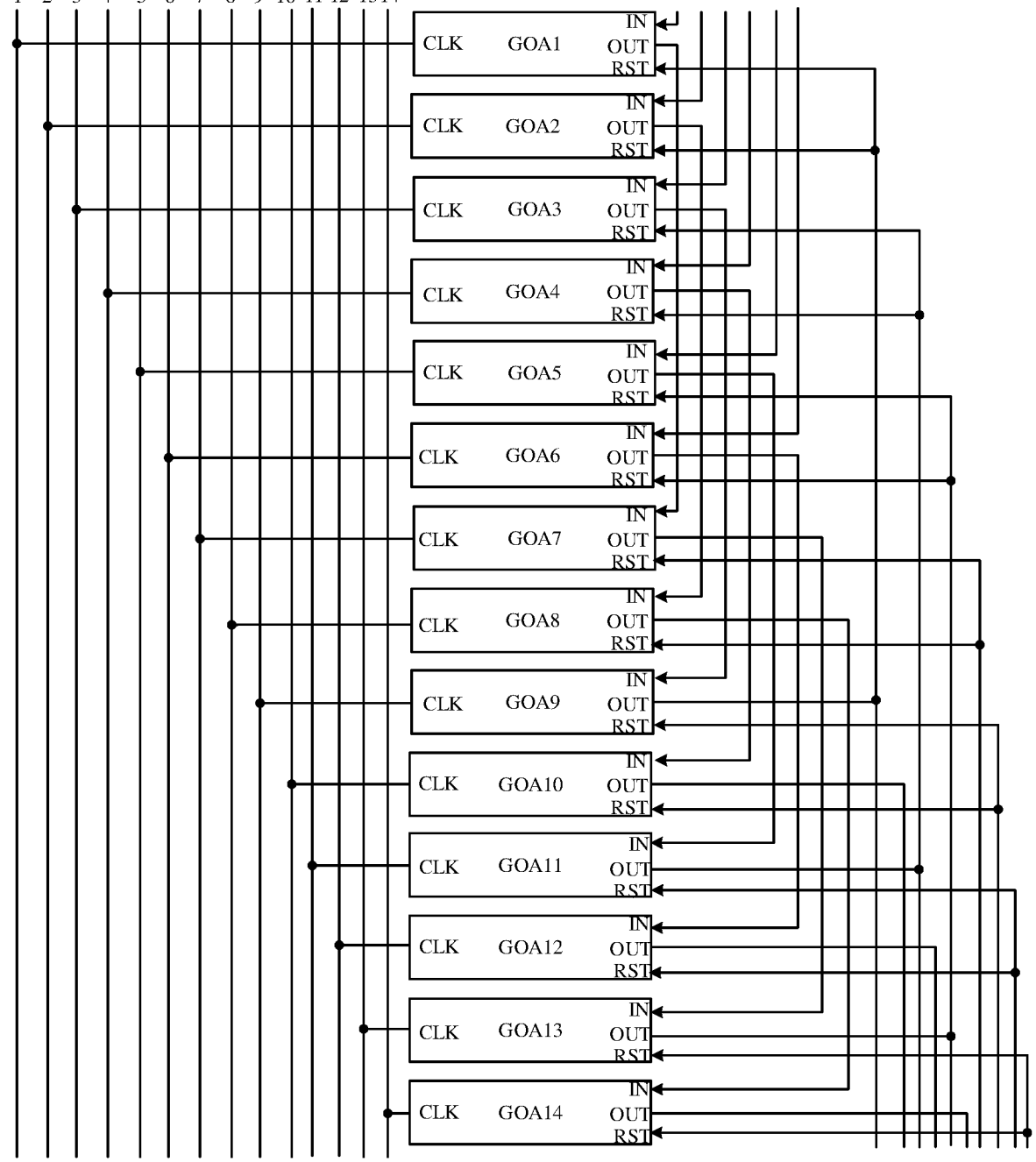
FIG. 15 illustrates a structural diagram of a gate driving circuit according to another embodiment of the present disclosure.

FIG. 15 shows a structural diagram of a gate driving circuit according to another embodiment of the present disclosure. In the gate driving circuit 1500 of FIG. 15, K=14, i=6, and j=8. The gate driving circuit 1500 of FIG. 15 is similar to the gate driving circuit 1200 of FIG. 12, and the difference is at least K=14. As shown in FIG. 15, an input signal terminal IN of a n-th stage of shift register GOAn is connected to an output signal terminal OUT of a (n−6)-th stage of shift register GOA(n−6), a reset signal terminal RST of the n-th stage of shift register GOAn and a reset signal terminal RST of a (n+1)-th stage of shift register GOA(n+1) are connected to an output signal terminal OUT of a (n+8)-th stage of shift register GOA(n+8).

However, the embodiments of the present disclosure are not limited thereto. In some embodiments, in the case of K=14, it is possible to set i=6 and j=10. In other embodiments, in the case of K=14, it is possible to set i=8 and n=12.

Figure 16A:
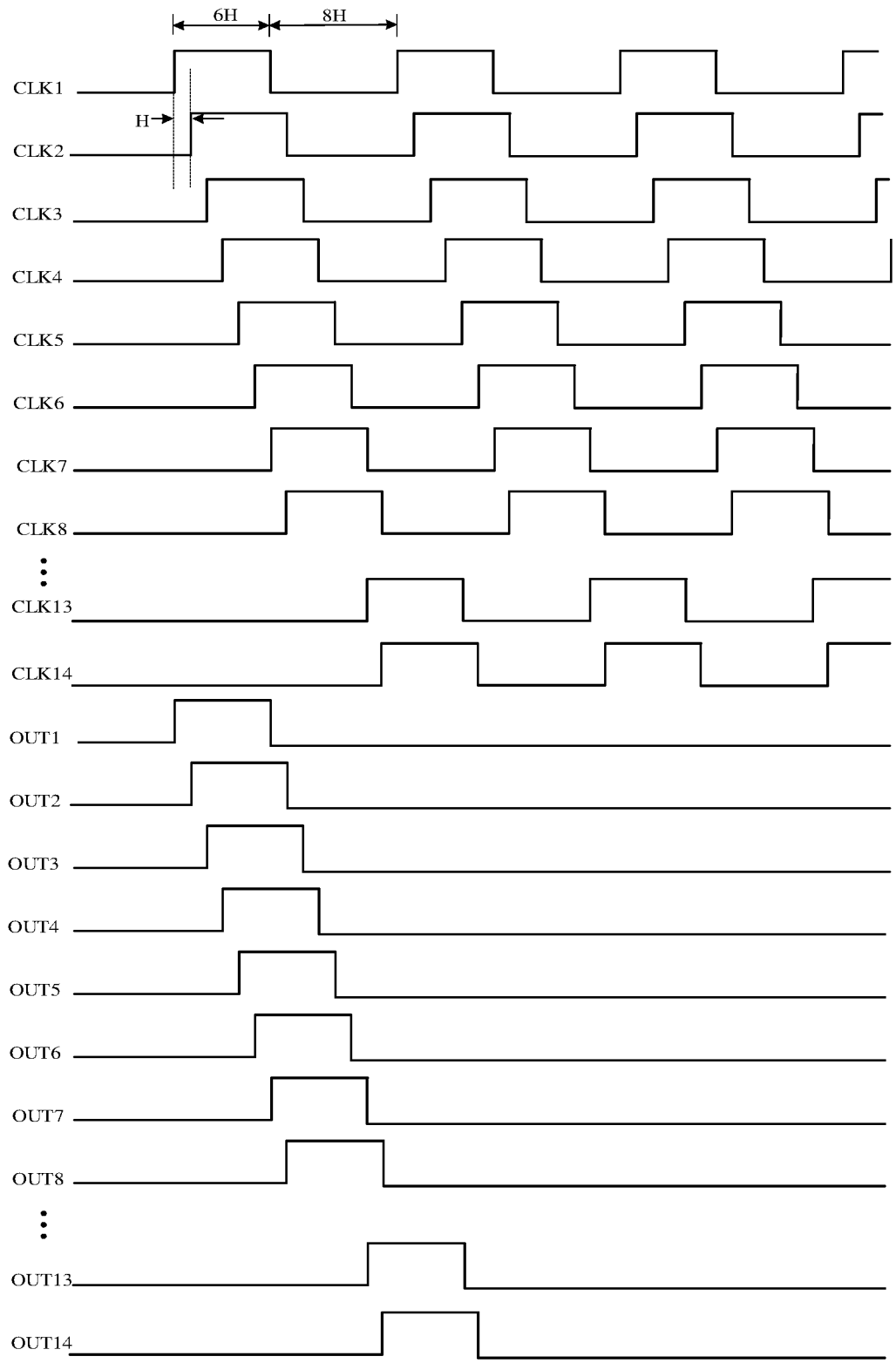
FIG. 16A illustrates a signal timing diagram of the gate driving circuit in a first mode in a case of K=14 according to an embodiment of the present disclosure.
Figure 16B:
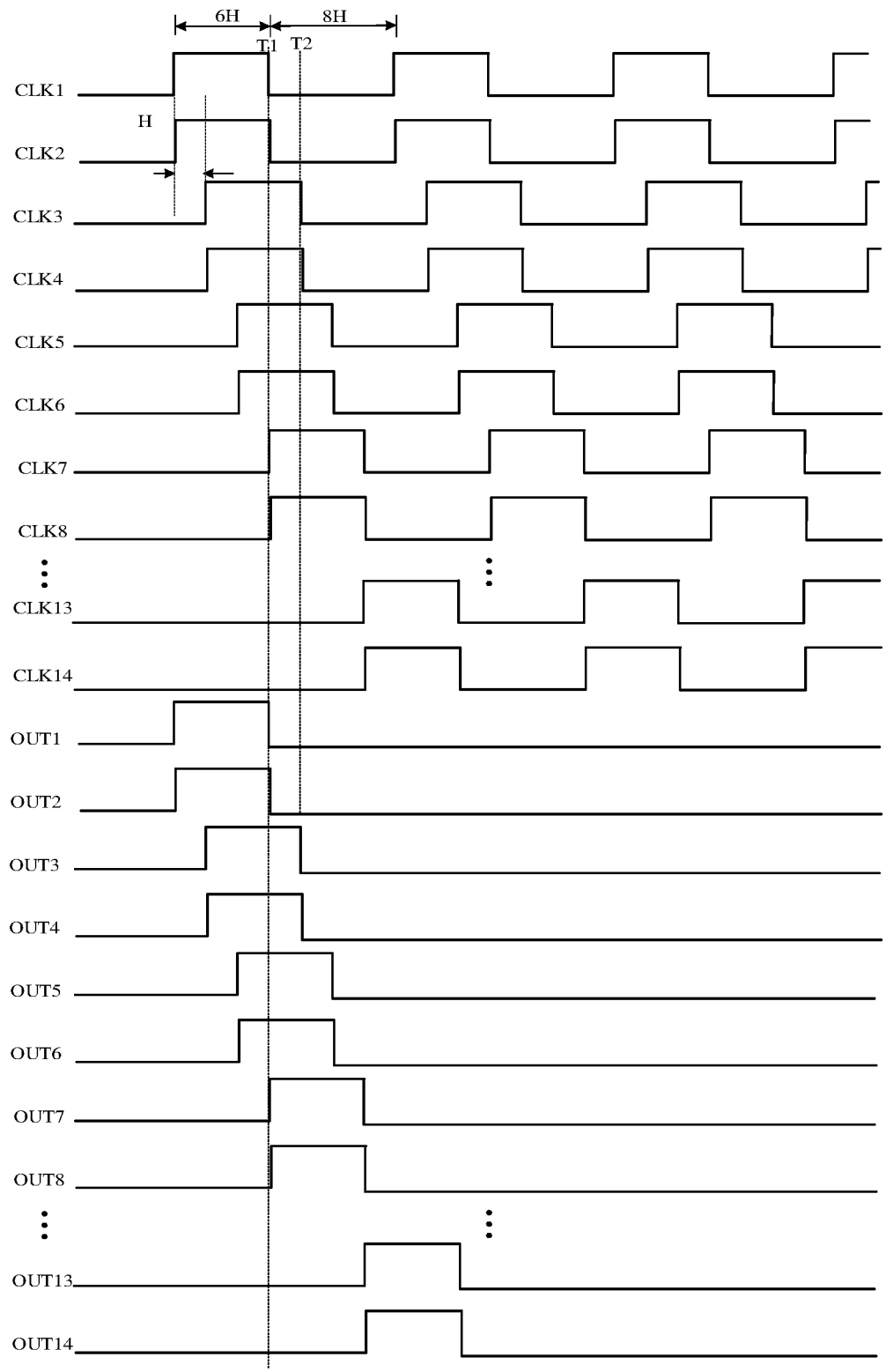
FIG. 16B illustrates a signal timing diagram of a gate driving circuit in a second mode in a case of K=14 according to the embodiments of the present disclosure.

FIG. 16A illustrates a signal timing diagram of a gate driving circuit in a first mode in a case of K=14 according to the embodiments of the present disclosure. FIG. 16B illustrates a signal timing diagram of a gate driving circuit in a second mode in a case of K=14 according to the embodiments of the present disclosure. The signal timing shown in FIGS. 16A and 16B may be used to drive the above-described gate driving circuit with K=14, such as the gate driving circuit 1500.

As shown in FIGS. 16A and 16B, clock signals CLK1 to CLK14 are cycle signals with a duty ratio of [(K−2)/2/K] *100%≈42.85%. In a signal cycle, a duration of a high level is [(K−2)/2]*H=6H, and a duration of a low level is 8H. In the first mode, as shown in FIG. 16A, the clock signals CLK1 to CLK14 are sequentially shifted by H, so that output signals OUT1 to OUT14 of shift registers GOA1 to GOA14 are sequentially shifted by H. In the second mode, as shown in FIG. 16B, among the clock signals CLK1 to CLK14, two adjacent clock signals are synchronized, while the two adjacent clock signals are shifted by 2H relative to the next two adjacent clock signals, so that output signals of the two adjacent stages of shift registers are synchronized, while the output signals of the two adjacent stages of shift registers are shifted by 2H relative to output signals of the next two adjacent stages of shift registers, thereby implementing two-rows by two-rows scanning of sub-pixels.

As shown in FIG. 16B, for the gate driving circuit 1500 of FIG. 15, at a time instant T1, the clock signals CLK1 and CLK2 provided to the shift registers GOA1 and GOA2 become a low level, and at a time instant T2 after the time instant T1, a reset signal (OUT9) of the shift register GOA1 and a reset signal (OUT9) of the shift register GOA2 become a high level, so that the pull-up node of each of the shift registers GOA1 and GOA2 has enough time to wait for the output signal terminal to become a low level before being reset, so as to alleviate or eliminate the above-mentioned tailing phenomenon.

Figure 17:
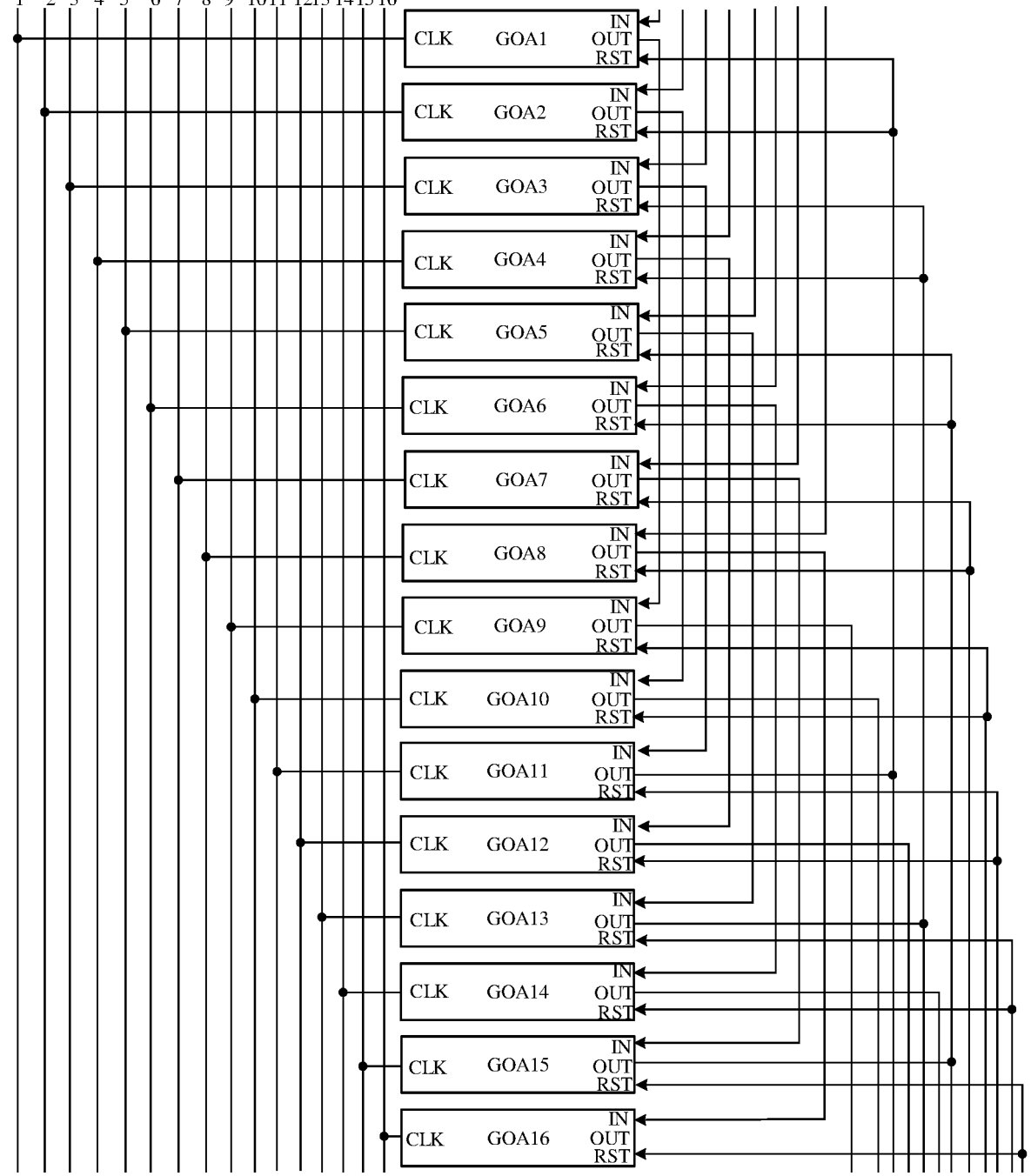
FIG. 17 illustrates a structural diagram of a gate driving circuit according to another embodiment of the present disclosure.

FIG. 17 illustrates a structural diagram of a gate driving circuit according to another embodiment of the present disclosure. In the gate driving circuit 1700 of FIG. 17, K=16, i=8, and j=10. The gate driving circuit 1700 is similar to the above-mentioned gate driving circuit 1500, and the difference lies in the values of K, i, and j. As shown in FIG. 17, sixteen clock signals CLK1 to CLK16 are used to control each set of sixteen shift registers. As shown in FIG. 17, the shift registers GOA1 to GOA16 are respectively connected to receive the clock signals CLK1 to CLK16, an input signal terminal IN of a n-th stage of shift register GOAn is connected to an output signal terminal OUT of a (n−8)-th stage of shift register GOA (n−8), and a reset signal terminal RST of the n-th stage of shift register GOAn and a reset signal terminal RST of a (n+1)-th stage of shift register GOA(n+1) are connected to an output signal terminal OUT of a (n+10)-th stage of shift register GOA(n+10).

However, the embodiments of the present disclosure are not limited thereto. In some embodiments, in the case of K=16, it is possible to set i=6 and j=8. In other embodiments, in the case of K=16, it is possible to set i=8 and j=12. In yet other embodiments, in the case of K=16, it is possible to set i=8 and j=14.

Figure 18A:
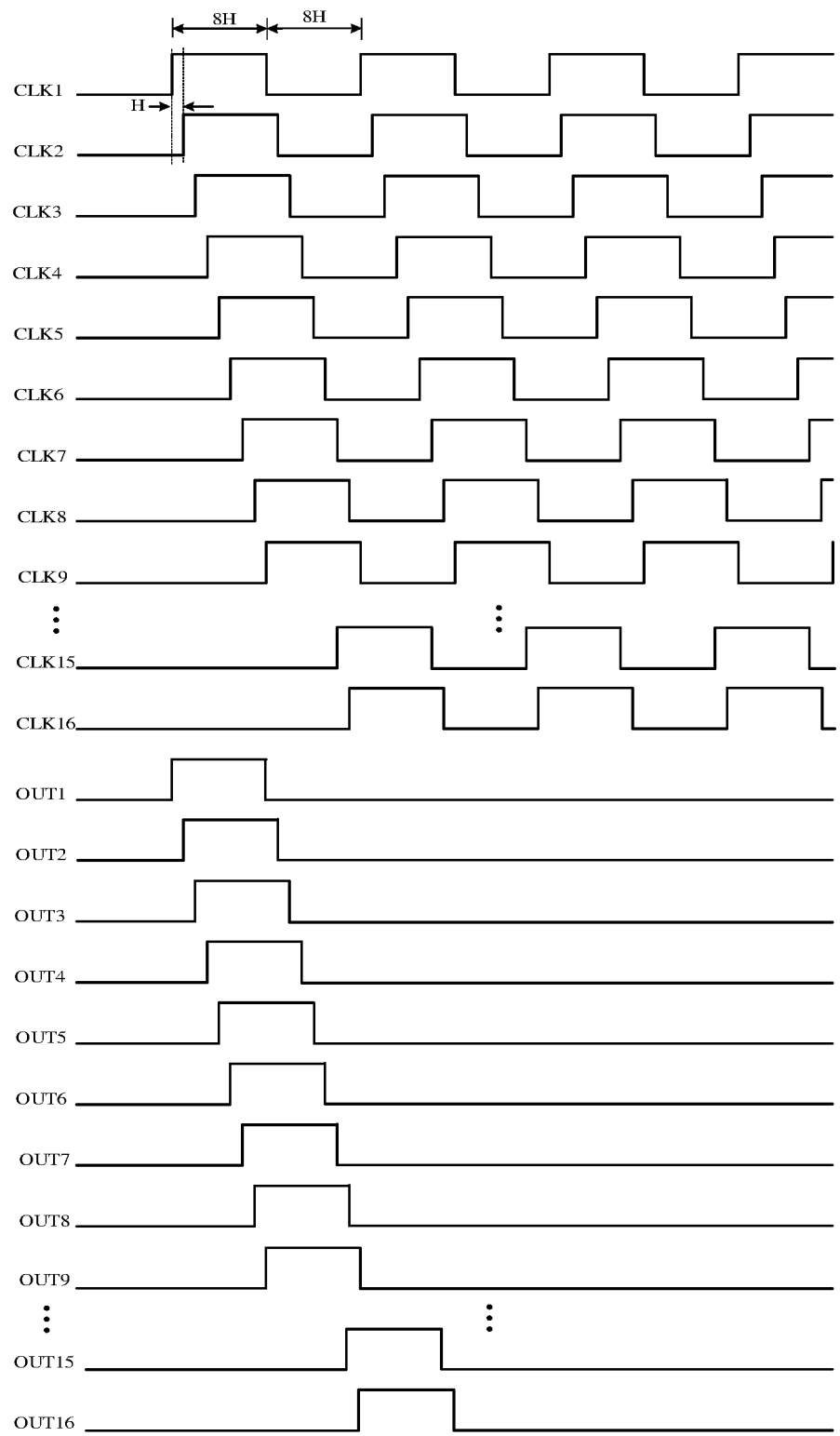
FIG. 18A illustrates a signal timing diagram of a gate driving circuit in a first mode in a case of K=16 according to the embodiments of the present disclosure.
Figure 18B:
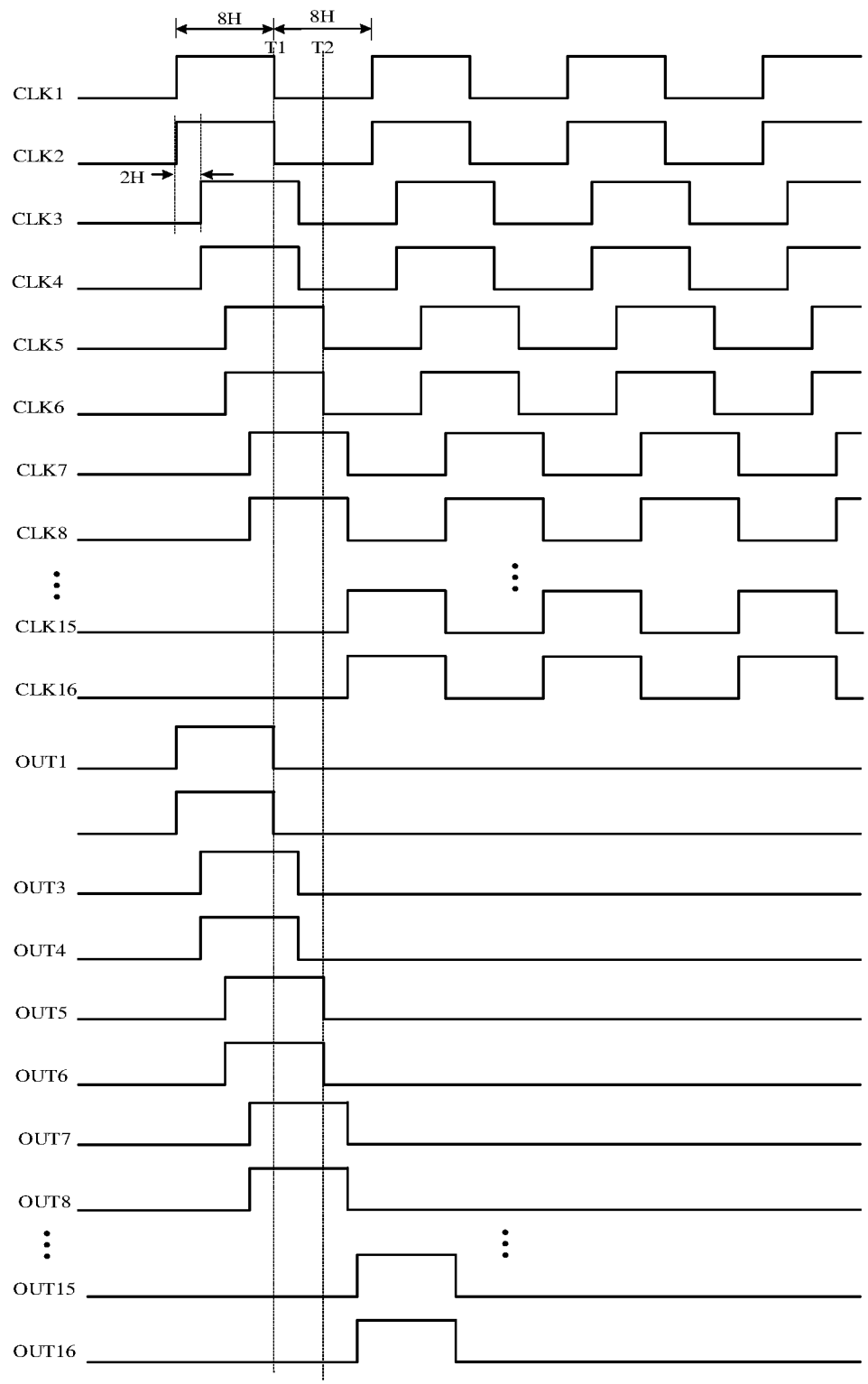
FIG. 18B illustrates a signal timing diagram of a gate driving circuit in a second mode in a case of K=16 according to the embodiments of the present disclosure.

FIG. 18A illustrates a signal timing diagram of a gate driving circuit in a first mode in a case of K=16 according to the embodiments of the present disclosure. FIG. 18B illustrates a signal timing diagram of a gate driving circuit in a second mode in a case of K=16 according to the embodiments of the present disclosure. The signal timing shown in FIGS. 18A and 18B may be used to drive the above-described gate driving circuit with K=16, such as the gate driving circuit 1700.

As shown in FIGS. 18A and 18B, clock signals CLK1 to CLK16 are cycle signals with a duty ratio of 50%. In a signal cycle, a duration of a high level is (K/2)*H=8H, and a duration of a low level is 8H. In the first mode, as shown in FIG. 18A, the clock signals CLK1 to CLK16 are sequentially shifted by H, so that output signals OUT1 to OUT16 of shift registers GOA1 to GOA16 are sequentially shifted by H. In the second mode, as shown in FIG. 18B, among the clock signals CLK1 to CLK16, two adjacent clock signals are synchronized, while the two adjacent clock signals are shifted by 2H relative to the next two adjacent clock signals, so that output signals of the two adjacent stages of shift registers are synchronized, while the output signals of the two adjacent stages of shift registers are shifted by 2H relative to output signals of the next two adjacent stages of shift registers, thereby implementing two-rows by two-rows scanning of sub-pixels.

As shown in FIG. 18B, for the gate driving circuit 1700 of FIG. 17, at a time instant T1, the clock signals CLK1 and CLK2 provided to the shift registers GOA1 and GOA2 become a low level, and at a time instant T2 after the time instant T1, a reset signal (OUT11) of the shift register GOA1 and a reset signal (OUT11) of the shift register GOA2 become a high level, so that the pull-up node of each of the shift registers GOA1 and GOA2 has enough time to wait for the output signal terminal to become a low level before being reset, so as to alleviate or eliminate the above-mentioned tailing phenomenon.

Figure 19:
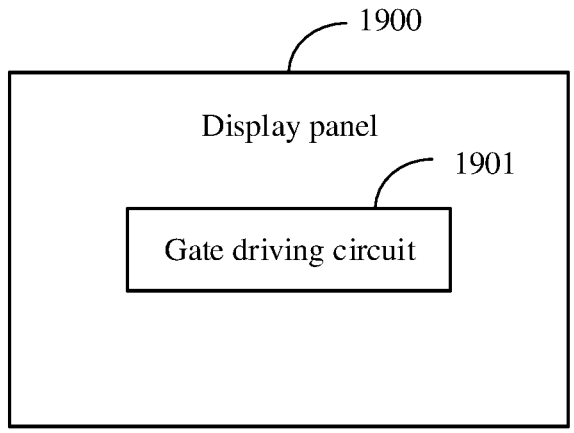
FIG. 19 illustrates a schematic block diagram of a display device according to the embodiments of the present disclosure.

FIG. 19 illustrates a schematic block diagram of a display device according to the embodiments of the present disclosure.

As shown in FIG. 19, the display panel 1900 includes a gate driving circuit 1901, and the gate driving circuit 1901 may be implemented by the gate driving circuit of any of the above-mentioned embodiments, such as one of the gate driving circuits 600, 900, 1000, 1200, 1300, 1500 and 1700. The display panel may have 8K resolution, for example, the sub-pixels in the display area of the display panel are arranged in a 7680×4320 array, in the case that the refresh frequency is 60 Hz, H=1/60÷4320≈3.7 μs, and in the case that the refresh rate is 120 Hz, H is about 1.85 μs.

Figure 20:
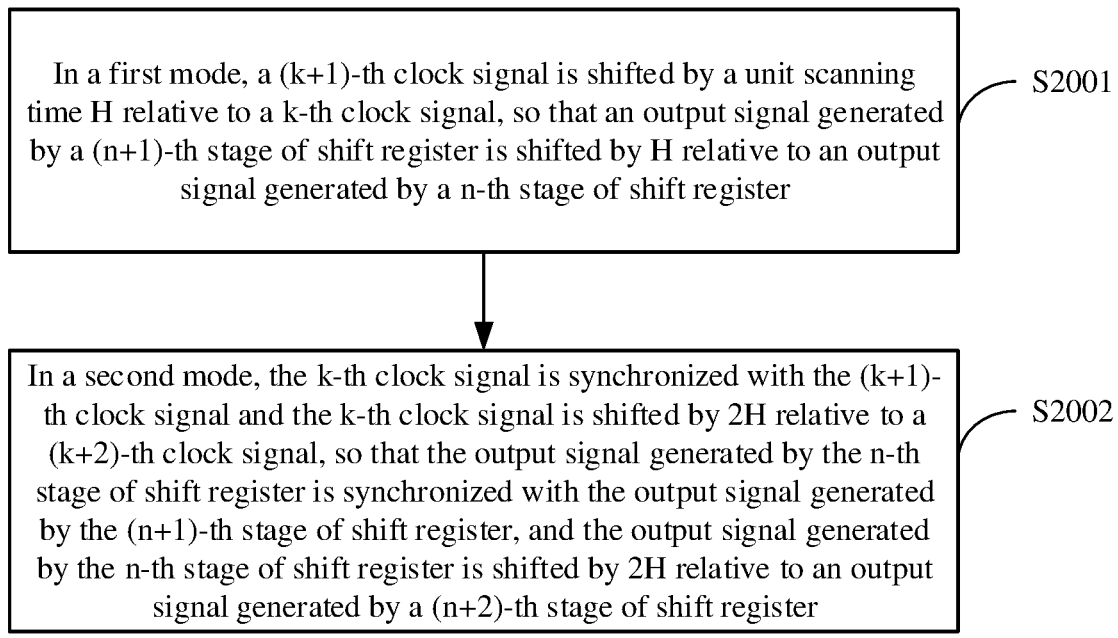
FIG. 20 illustrates a flowchart of a method for driving a gate driving circuit according to the embodiments of the present disclosure.

FIG. 20 illustrates a flowchart of a method for driving a gate driving circuit according to the embodiments of the present disclosure. The driving method is applicable to the gate driving circuit of any of the above-mentioned embodiments. In the driving method, a first clock signal to a K-th clock signal are applied to the gate driving circuit, so that each stage of shift register of the gate driving circuit generates an output signal.

In step S2001, in a first mode, a (k+1)-th clock signal is shifted by H relative to a k-th clock signal, so that an output signal generated by a (n+1)-th stage of shift register is shifted by H relative to an output signal generated by a n-th stage of shift register, wherein H represents a unit scanning time which is a time duration required for the gate driving circuit to scan a row of pixels.

In step S2002, in a second mode, the k-th clock signal is synchronized with the (k+1)-th clock signal and the k-th clock signal is shifted by 2H relative to a (k+2)-th clock signal, so that the output signal generated by the n-th stage of shift register is synchronized with the output signal generated by the (n+1)-th stage of shift register, and the output signal generated by the n-th stage of shift register is shifted by 2H relative to an output signal generated by a (n+2)-th stage of shift register.

In some embodiments, when the number K of clock signals of the gate driving circuit satisfies K/2 being an even number, each of the first clock signal to the k-th clock signal may be set as a cycle signal having a duty cycle of 50%, with a duration of high level in each cycle being (K/2)*H. In some embodiments, when the number K of clock signals of the gate driving circuit satisfies K/2 is an odd number, each of the first clock signal to the k-th clock signal may be set to be a cycle signal having a duty cycle of [(K−2)/2/K] *100%, with a duration of high level in each cycle being [(K−2)/2]*H.

Those skilled in the art may understand that the embodiments described above are all exemplary, and those skilled in the art may improve thereof. The structures described in the various embodiments may be freely combined without any conflict in structure or principle.

After describing the preferred embodiments of the present disclosure in detail, those skilled in the art may clearly understand that various changes and variations may be made without departing from the scope and spirit of the appended claims. Moreover, the present disclosure is not limited to the implementation of the exemplary embodiments mentioned in the specification.

What is claimed is:

1. A gate driving circuit, comprising N-stages of cascaded shift registers, wherein:
   the N-stages of cascaded shift registers are divided into at least one group of K-stages cascaded shift registers in which a clock signal terminal of a k-th stage of shift register is connected to receive a k-th clock signal, wherein each of N, k and K is a positive integer, and 1≤k≤K≤N;
   an input signal terminal of a n-th stage of shift register is connected to an output signal terminal of a (n−i)-th stage of shift register, and a reset signal terminal of the n-th stage of shift register and a reset signal terminal of a (n+1)-th stage of shift register are connected to an output signal terminal of a (n+j)-th stage of shift register, wherein n is one of an odd number and an even number, each of i and j is a positive integer, 1<n<N, (K−2)/2≤i≤K/2, and K/2<j≤K−2; and
   wherein K=8, the input signal terminal of the n-th stage of shift register is connected to an output signal terminal of a (n−4)-th stage of shift register, and the reset signal terminal of the n-th stage of shift register and the reset signal terminal of the (n+1)-th stage of shift register are connected to an output signal terminal of a (n+6)-th stage of shift register.

2. The gate driving circuit of claim 1, wherein each of a first clock signal to a k-th clock signal is a cycle signal with a duty cycle of 50%, and each of the first clock signal to the k-th clock signal has a duration of high level being (K/2)*H in each cycle, wherein H represents a unit scanning time which is a time period required for the gate driving circuit to scan a row of pixels.

3. The gate driving circuit of claim 1, wherein each of the shift registers is configured to:
   provide a signal of an input signal terminal of the shift register to a pull-up node of the shift register;
   generate an output signal at an output signal terminal of the shift register based on a signal of a clock signal terminal of the shift register under a control of a potential of the pull-up node; and
   reset the pull-up node of the shift register under a control of a signal of a reset signal terminal of the shift register.

4. A display panel comprising a gate driving circuit, wherein the gate driving circuit comprises N-stages of cascaded shift registers, wherein:
   the N-stages of cascaded shift registers are divided into at least one group of K-stages cascaded shift registers in which a clock signal terminal of a k-th stage of shift register is connected to receive a k-th clock signal, wherein each of N, k and K is a positive integer, and 1≤k≤K≤N;

an input signal terminal of a n-th stage of shift register is connected to an output signal terminal of a (n−i)-th stage of shift register, and a reset signal terminal of the n-th stage of shift register and a reset signal terminal of a (n+1)-th stage of shift register are connected to an output signal terminal of a (n+j)-th stage of shift register, wherein n is one of an odd number and an even number, each of i and j is a positive integer, $1<n<N$, $(K-2)/2 \le i \le K/2$, and $K/2 < j \le K-2$; and wherein K=8, the input signal terminal of the n-th stage of shift register is connected to an output signal terminal of a (n−4)-th stage of shift register, and the reset signal terminal of the n-th stage of shift register and the reset signal terminal of the (n+1)-th stage of shift register are connected to an output signal terminal of a (n+6)-th stage of shift register.

5. A method for driving a gate driving circuit, wherein the gate driving circuit comprising N-stages of cascaded shift registers, wherein:

the N-stages of cascaded shift registers are divided into at least one group of K-stages cascaded shift registers in which a clock signal terminal of a k-th stage of shift register is connected to receive a k-th clock signal, wherein each of N, k and K is a positive integer, and $1 \le k \le K \le N$;

an input signal terminal of a n-th stage of shift register is connected to an output signal terminal of a (n−i)-th stage of shift register, and a reset signal terminal of the n-th stage of shift register and a reset signal terminal of a (n+1)-th stage of shift register are connected to an output signal terminal of a (n+j)-th stage of shift register, wherein n is one of an odd number and an even number, each of i and j is a positive integer, $1<n<N$, $(K-2)/2 \le i \le K/2$, and $K/2 < j \le K-2$; and wherein K=8, the input signal terminal of the n-th stage of shift register is connected to an output signal terminal of a (n−4)-th stage of shift register, and the reset signal terminal of the n-th stage of shift register and the reset signal terminal of the (n+1)-th stage of shift register are connected to an output signal terminal of a (n+6)-th stage of shift register;

the method comprising:

applying a first clock signal to a k-th clock signal to the gate driving circuit, so that each stage of shift registers in the gate driving circuit generates an output signal, wherein:

in a first mode, a (k+1)-th clock signal is shifted by H relative to the k-th clock signal, so that an output signal generated by a (n+1)-th stage of shift register is shifted by H relative to an output signal generated by a n-th stage of shift register, wherein H represents a unit scanning time which is a time period required for the gate driving circuit to scan a row of pixels; and in a second mode, the k-th clock signal is synchronized with the (k+1)-th clock signal and the k-th clock signal is shifted by 2H relative to a (k+2)-th clock signal, so that the output signal generated by the n-th stage of shift register is synchronized with the output signal generated by the (n+1)-th stage of shift register, and the output signal generated by the n-th stage of shift register is shifted by 2H relative to an output signal generated by a (n+2)-th stage of shift register.

6. The method of claim 5, wherein each of the first clock signal to the k-th clock signal is a cycle signal having a duty cycle of 50%, and each of the first clock signal to the k-th clock signal has a duration of high level being (K/2)*H in each cycle.

* * * * *